(12) United States Patent
Park et al.

(10) Patent No.: US 12,055,854 B2
(45) Date of Patent: Aug. 6, 2024

(54) COATING COMPOSITION FOR PHOTORESIST UNDERLAYER

(71) Applicant: ROHM AND HAAS ELECTRONIC MATERIALS KOREA LTD., Cheonan-si (KR)

(72) Inventors: Jin Hong Park, Hwaseong-si (KR); Yoo-Jin Ghang, Hwaseong-si (KR); Suwoong Kim, Hwaseong-si (KR); You Rim Shin, Hwaseong-si (KR); Jung June Lee, Hwaseong-si (KR); Jae Hwan Sim, Hwaseong-si (KR)

(73) Assignee: ROHM AND HAAS ELECTRONIC MATERIALS KOREA LTD., Cheonan-si (KR)

( * ) Notice: Subject to any disclaimer, the term of this patent is extended or adjusted under 35 U.S.C. 154(b) by 741 days.

(21) Appl. No.: 17/138,069

(22) Filed: Dec. 30, 2020

(65) Prior Publication Data

US 2021/0200093 A1    Jul. 1, 2021

Related U.S. Application Data

(60) Provisional application No. 62/955,773, filed on Dec. 31, 2019.

(51) Int. Cl.
| | |
|---|---|
| *G03F 7/11* | (2006.01) |
| *C08F 20/32* | (2006.01) |
| *C08G 63/91* | (2006.01) |
| *C09D 133/14* | (2006.01) |
| *C09D 167/02* | (2006.01) |
| *G03F 7/038* | (2006.01) |

(52) U.S. Cl.
CPC ............ *G03F 7/11* (2013.01); *C08F 20/32* (2013.01); *C08G 63/916* (2013.01); *C09D 133/14* (2013.01); *C09D 167/02* (2013.01); *G03F 7/038* (2013.01)

(58) Field of Classification Search
CPC ............................. G03F 7/11; C09D 113/14
See application file for complete search history.

(56) References Cited

U.S. PATENT DOCUMENTS

| | | | |
|---|---|---|---|
| 4,442,197 A | 4/1984 | Crivello et al. | |
| 4,603,101 A | 7/1986 | Crivello | |
| 5,468,589 A | 11/1995 | Urano et al. | |
| 5,736,296 A | 4/1998 | Sato et al. | |
| 5,780,206 A | 7/1998 | Urano et al. | |
| 5,976,759 A | 11/1999 | Urano et al. | |
| 6,261,743 B1 | 7/2001 | Pavelchek et al. | |
| 6,686,121 B2 | 2/2004 | Okazaki et al. | |
| 6,838,224 B2 | 1/2005 | Ohsawa et al. | |
| 7,150,956 B2 | 12/2006 | Nitta et al. | |
| 9,005,873 B2 | 4/2015 | Sakamoto et al. | |
| 9,250,532 B2 | 2/2016 | Kato et al. | |
| 2001/0021479 A1 | 9/2001 | Kawabe et al. | |
| 2002/0156199 A1 | 10/2002 | Sheehan et al. | |
| 2003/0180559 A1* | 9/2003 | Wayton | C09D 167/00 430/271.1 |
| 2005/0118749 A1* | 6/2005 | Sakamoto | G03F 7/091 438/107 |
| 2006/0290429 A1 | 12/2006 | Kishioka et al. | |
| 2012/0004029 A1 | 1/2012 | Morrow | |
| 2012/0040291 A1 | 2/2012 | Sakamoto et al. | |
| 2012/0219907 A1 | 8/2012 | Ichikawa et al. | |
| 2014/0272723 A1* | 9/2014 | Somervell | B82Y 10/00 430/325 |
| 2015/0004533 A1 | 1/2015 | Hirano et al. | |
| 2018/0246409 A1 | 8/2018 | Toida et al. | |
| 2018/0362752 A1 | 12/2018 | Aquad et al. | |
| 2019/0219921 A1 | 7/2019 | Tsubaki et al. | |

FOREIGN PATENT DOCUMENTS

| | | |
|---|---|---|
| EP | 0588544 A2 | 3/1994 |
| WO | 2013141015 A1 | 9/2013 |

OTHER PUBLICATIONS

Chung et al. "Insertion Effects of Various Acid Sensitive Groups into Acetal-type Polymer on the Profile of 248-nm Chemically Amplified Resist" Proceedings vol. 4690, Advances in Resist Technology and Processing XIX; (2002) https://doi.org/10.1117/12.474266.

Houben-Weyl, "Methoden der Organischen Chemie, Band E20, Makromolekulare Soffe, Polyester," (Georg Thieme Verlag, Stuttgart 1987), 44 pages, English Translation.

Kometani et al. "Recent Advances in Increasing the Thermal Flow Resistance of Acetal-Derivatized Polyhydroxystyrene Deep-UV Matrix Resins", Proc. SPIE 3333, Advances in Resist Technology and Processing XV, (Jun. 29, 1998); https://doi.org/10.1117/12.312466 (1988).

Wicks et al., "Organic Coatings, Science and Technology," pp. 246-257. 1999, second edition.

* cited by examiner

*Primary Examiner* — Mark F. Huff
*Assistant Examiner* — Nicholas E Brown
(74) *Attorney, Agent, or Firm* — CANTOR COLBURN LLP

(57) ABSTRACT

A coating composition comprising a crosslinkable polyester polymer comprising an isocyanurate group and a crosslinkable group; a crosslinker; and an acid catalyst, wherein at least one of the crosslinkable polyester polymer and the crosslinker comprises an iodine-containing polymer.

20 Claims, No Drawings

COATING COMPOSITION FOR PHOTORESIST UNDERLAYER

CROSS-REFERENCE TO RELATED APPLICATION

This application claims priority to and the benefit of U.S. Provisional Patent Application No. 62/955,773 filed in the USPTO on Dec. 31, 2019, the entire content of which is incorporated herein by reference.

BACKGROUND

Extreme ultraviolet lithography ("EUVL") is one of the leading technology options to replace optical lithography for volume semiconductor manufacturing at feature sizes <20 nm. The extremely short wavelength (13.4 nm) is a key enabling factor for high resolution required at multiple technology generations. In addition, the overall system concept—scanning exposure, projection optics, mask format, and resist technology—is quite similar to that used for current optical technologies. Like previous lithography generations, EUVL consists of resist technology, exposure tool technology, and mask technology. The key challenges are EUV source power and throughput. Any improvement in EUV power source will directly impact the currently strict resist sensitivity specification. Indeed, a major issue in EUVL imaging is resist sensitivity, the lower the sensitivity, the greater the source power that is needed or the longer the exposure time that is required to fully expose the resist. The lower the power levels, the more noise affects the line edge roughness ("LER") of the printed lines.

Improving EUVL sensitivity is a key enabling factor. It has been shown that EUV light absorption cross-section and secondary electron generation yield are critical factors for EUVL sensitivity. One way to increase EUVL photoresist sensitivity is by increasing its absorption cross-section at 13.5 nm, which is an atomic property of the material that can be theoretically calculated using known atomic absorptions. Typical atoms that make up resist materials, such as carbon, oxygen, hydrogen, and nitrogen possess very weak absorption at 13.5 nm. A fluorine atom has slightly higher absorption and has been used in the search for high EUV absorbing photoresist.

Iodine has remarkably high EUV light absorption cross-section. Iodine-containing monomers and corresponding polymers can be useful for lithographic processing. These materials have been applied primarily for resist compositions and not underlayer compositions, with the exception of U.S. Pat. No. 9,005,873 B2, which describes an underlayer composition having a novolac resin containing a halogen atom. There remains a need for iodine-rich monomers and corresponding polymers for use in underlayer compositions having a high dry etch rate to impart improved sensitivity to an overcoated EUV photoresist.

SUMMARY

Provided is a coating composition including a crosslinkable polyester polymer including an isocyanurate group and a crosslinkable group; a crosslinker; and an acid catalyst, wherein at least one of the crosslinkable polyester polymer and the crosslinker includes an iodine-containing polymer.

Another aspect provides a coated substrate including a layer of the coating composition disposed on a substrate; and a photoresist layer disposed on the layer of the coating composition.

Still another aspect provides a method of forming an electronic device including applying a layer of the coating composition on a substrate; curing the coating composition to form an underlayer film; applying a layer of a photoresist composition on the underlayer film to form a photoresist layer; pattern-wise exposing the photoresist layer to radiation; and developing the exposed photoresist layer to provide a resist relief image.

DETAILED DESCRIPTION

Reference will now be made in detail to exemplary aspects, examples of which are illustrated in the present description. In this regard, the present exemplary aspects may have different forms and should not be construed as being limited to the descriptions set forth herein. Accordingly, the exemplary aspects are merely described below to explain aspects of the present description. The terminology used herein is for the purpose of describing particular aspects only and is not intended to be limiting.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of two; "cycloalkenyl group" refers to a non-aromatic cyclic divalent hydrocarbon group having at least three carbon atoms, with at least one carbon-carbon double bond; "alkynyl group" refers to a monovalent hydrocarbon group having at least one carbon-carbon triple bond; "aryl group" refers to a monovalent aromatic monocyclic or polycyclic ring system, and may include a group with an aromatic ring fused to at least one cycloalkyl or heterocycloalkyl ring; "arylene group" refers to an aryl group having a valence of two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroalkyl group" refers to an alkyl group having 1-3 heteroatoms instead of carbon; "heterocycloalkyl group" refers to a cycloalkyl group having 1-3 heteroatoms as ring members instead of carbon; "heterocycloalkylene group" refers to a heterocycloalkyl group having a valence of two; "heteroaryl group" refers to an aromatic group having 1-4 heteroatoms as ring members instead of carbon.

The term "halogen" means a monovalent substituent that is fluorine (fluoro), chlorine (chloro), bromine (bromo), or iodine (iodo). The prefix "halo" means a group including one more of a fluoro, chloro, bromo, or iodo substituent instead of a hydrogen atom. A combination of halo groups (e.g., bromo and fluoro), or only fluoro groups may be present.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—NO$_2$), cyano (—CN), hydroxyl (—OH), oxo (=O), amino (—NH$_2$), mono- or di-(C$_{1-6}$)alkylamino, alkanoyl (such as a C$_{2-6}$ alkanoyl group such as acyl), formyl (—C(=O)H), carboxylic acid or an alkali metal or ammonium salt thereof, C$_{2-6}$ alkyl ester (—C(=O)O-alkyl or —OC(=O)-alkyl), C$_{7-13}$ aryl ester (—C(=O)O-aryl or —OC(=O)-aryl), amido (—C(=O)NR$_2$ wherein R is hydrogen or C$_{1-6}$ alkyl), carboxamido (—CH$_2$C(=O)NR$_2$ wherein R is hydrogen or C$_{1-6}$ alkyl), halogen, thiol (—SH), C$_{1-6}$ alkylthio (—S-alkyl), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl having at least one aromatic ring (e.g., phenyl, biphenyl, naphthyl, or the like, each ring either substituted or unsubstituted aromatic), C$_{7-19}$ arylalkyl having 1 to 3 separate or fused rings and from 6 to 18 ring carbon atoms, arylalkoxy having 1 to 3 separate or fused rings and from 6 to 18 ring carbon atoms, C$_{7-12}$ alkylaryl, C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a C$_2$ alkyl group substituted with a cyano group.

The term "(meth)acrylate" is inclusive of both methacrylate and acrylate, the term "(meth)allyl" is inclusive of both methallyl and allyl, and the term "(meth)acrylamide" is inclusive of both methacrylamide and acrylamide.

The inventors have discovered that resist underlayer films derived from the presently disclosed iodine-containing polyester and/or (meth)acrylate polymers can improve resist sensitivity during EUV lithography. The presently disclosed resist underlayer films can also achieve a higher dry etch rate than a comparable halogen-containing novolac resin, such as disclosed in U.S. Patent Pub. No. 2012/004029 A1. For example the inventive coating composition can achieve a dry etch rate that is at least about twice that of a comparable halogen-containing novolac resin.

Accordingly, an aspect provides a coating composition comprising a crosslinkable polyester polymer; a crosslinker; and an acid catalyst. The crosslinkable polyester polymer comprises an isocyanurate group and a crosslinkable group. At least one of the crosslinkable polyester polymer and the crosslinker comprises an iodine-containing polymer.

The crosslinkable polyester polymer of the coating composition is not crosslinked (i.e., non-crosslinked), such that the coating composition may be applied to a substrate prior to crosslinking of the components in the coating composition. The crosslinkable polyester polymer may be a homopolymer, copolymer, or oligomer unless clearly indicated otherwise by the context. For example, the crosslinkable polyester polymer may be a homopolymer having the same repeating structural unit. Alternatively, the crosslinkable polyester polymer may be a copolymer having two or more different repeating structural units and may be, for example, a random copolymer or a block copolymer.

In an aspect, the crosslinkable polyester polymer is an iodine-containing polyester polymer derived from a compound of Formula (1):

In Formula (1), D is a single bond, or an unsubstituted or substituted C$_{1-4}$ alkylene group. It is to be understood that "I" in Formula (1) is an iodine atom. In Formula (1), m is an integer of 0 to 4, typically 0 or 1; n is an integer of 1 to 3; and the sum of m and n is less than 6, typically an integer from 1 to 4, or 1 to 3, or 2 to 3. At least one hydrogen atom of the iodine-containing polyester polymer (1) is substituted with a functional group independently chosen from hydroxyl, carboxyl, thiol, amino, epoxy, alkoxy, amido, vinyl, and a combination thereof. Of these, hydroxyl, carboxyl, or alkoxy are preferred.

In Formula (1), Y is —H, —OH, —C(O)OH, —C(O)OR, or epoxy, wherein R is hydrogen, an unsubstituted or substituted C$_{1-10}$ alkyl group, an unsubstituted or substituted C$_{3-30}$ cycloalkyl group, an unsubstituted or substituted C$_{1-30}$ heterocycloalkyl group, an unsubstituted or substituted C$_{6-30}$ aryl group, an unsubstituted or substituted C$_{7-30}$ arylalkyl group, an unsubstituted or substituted C$_{1-30}$ heteroaryl group, or an unsubstituted or substituted C$_{3-30}$ heteroarylalkyl group.

In Formulae (1), each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group.

In an aspect, the compound of Formula (1) may be a compound of Formula (1a):

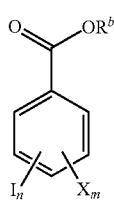

(1a)

In Formula (1a), I, X, m, and n are the same as in Formula (1). In Formula (1a), R is an unsubstituted or substituted $C_{1-10}$ alkyl group, an unsubstituted or substituted $C_{3-30}$ cycloalkyl group, an unsubstituted or substituted $C_{1-30}$ heterocycloalkyl group, an unsubstituted or substituted $C_{6-30}$ aryl group, an unsubstituted or substituted $C_{7-30}$ arylalkyl group, an unsubstituted or substituted $C_{1-30}$ heteroaryl group, or an unsubstituted or substituted $C_{3-30}$ heteroarylalkyl group. At least one hydrogen atom of the iodine-containing polyester polymer (1a) is substituted with a functional group independently chosen from hydroxyl, carboxyl, thiol, amino, epoxy, alkoxy, amido, vinyl, and a combination thereof. Of these, hydroxyl, carboxyl, or alkoxy are preferred.

Suitable compounds of Formula (1) include, for example, the following:

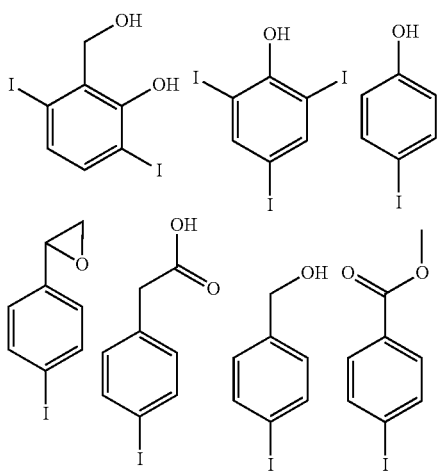

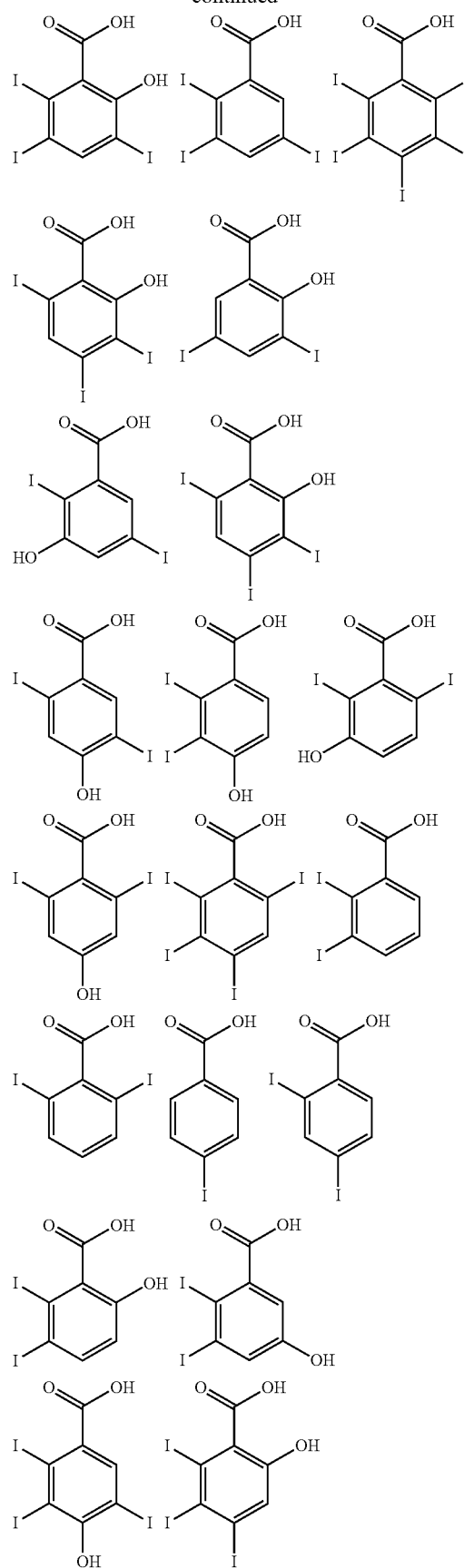

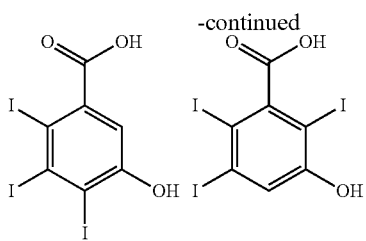

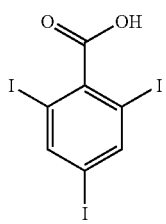

In an aspect, the crosslinkable polyester polymer comprises an isocyanurate repeating unit derived from a monomer of Formula (2):

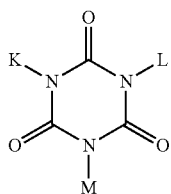

(2)

In Formula (2), K, L, and M are each independently a linear or branched $C_{1-10}$ hydrocarbon group, a $C_{1-10}$ alkoxycarbonyl group, a $C_{1-10}$ alkanoyloxy group, each of which is optionally substituted with a carboxylic acid group, or a linear or branched $C_{1-10}$ hydroxyalkyl group optionally substituted with a $C_{1-5}$ alkoxycarbonyl group or a $C_{1-5}$ substituted alkoxy group.

In Formula (2), for K, L, and M, each of the $C_{1-10}$ hydrocarbon group, the $C_{1-10}$ alkoxycarbonyl group, the $C_{1-10}$ alkanoyloxy group, and the $C_{1-10}$ hydroxyalkyl group is optionally substituted with at least one of a halogen, an amino group, a thiol group, an epoxy group, an amido group, a $C_{1-s}$ alkyl group, a $C_{3-8}$ cycloalkyl group, a $C_{3-20}$ heterocycloalkyl group, a $C_{2-5}$ alkenyl group, a $C_{1-s}$ alkoxy group, a $C_{2-5}$ alkenoxy group, a $C_{6-10}$ aryl group, a $C_{6-10}$ aryloxy group, a $C_{7-10}$ alkylaryl group, or $C_{7-10}$ alkylaryloxy group. The $C_{3-8}$ cycloalkyl group and the $C_{3-20}$ heterocycloalkyl group can be optionally substituted on at least one ring carbon atom with an oxo group (═O). At least one hydrogen atom of the polyester polymer (2) is substituted with a functional group independently chosen from hydroxyl, carboxyl, thiol, amino, epoxy, alkoxy, amido, vinyl, and a combination thereof. Of these, hydroxyl, carboxyl, or alkoxy are preferred.

The crosslinkable polyester polymer and the crosslinkable iodine-containing polyester polymer may be formed by conventional polycondensation techniques such as for example described in Zeno W. Wicks, Jr, Frank N. Jones, S. Peter Pappas, "Organic Coatings, Science and Technology," pp 246-257 (John Wiley & Sons, 1999, second edition) and references therein or in Houben-Weyl, "Methoden der Organischen Chemie, Band E20, Makromolekulare Soffe, Polyester," pp 1405-1429. (Georg Thieme Verlag, Stuttgart 1987) and references therein. In one aspect, a diol or polyol and a di-carboxylic acid or polycarboxylic acid are charged into a conventional polymerization vessel and reacted between about 150 and 280° C. for several hours. Optionally, an esterification catalyst may be used to decrease the reaction time. It is also understood that an esterifiable derivative of a polycarboxylic acid, such as a dimethyl ester or anhydride of a polycarboxylic acid, can be used to prepare the polyester. Exemplary polyols and polycarboxylic acids include isocyanurate polyols and isocyanurate polycarboxylic acids. The polyester polymers can be linear or branched.

Suitable diols and polyols include, but are not limited to, ethylene glycol, diethylene glycol, triethylene glycol and higher polyethylene glycols, propylene glycol, dipropylene glycol, tripropylene glycol and higher polypropylene glycols, 1,3-propanediol, 1,4-butanediol and other butanediols, 1,5-pentanediol and other pentane diols, hexanediols, decanediols, and dodecanediols, glycerol, trimethylolpropane, trimethylolethane, neopentyl glycol, pentaerythritol, cyclohexanedimethanol, dipentaerythtritol, 1, 2-methyl-1,3-propanediol, 1,4-benzyldimethanol, 2,4-dimethyl-2-ethylhexane-1,3-diol, isopropylidene bis (p-phenylene-oxypropanol-2), 4,4'-dihydroxy-2,2'-diphenylpropane, 1,3-cyclohexanedimethanol, 1,4-cyclohexanedimethanol (or mixtures of 1,3 and 1,4 cyclohexanedimethanol, may be cis or trans), sorbitol, or the like, or combinations thereof.

In an aspect, the iodine-containing polyester polymer may be prepared from the polyester polymer derived from Formula (2) and the compound of Formula (1) using any suitable method. The reaction conditions and components can be selected to accommodate the reactive functional group on each of the polyester polymer and the compound of Formula (1). In another aspect, the iodine-containing polyester polymer can be prepared from reacting the compound of Formula (1) with isocyanurate precursors, such as tris(hydroxyethyl)isocyanurate, tris(carboxyethyl) isocyanurate, 1,2-propanediol, propylene glycol monomethyl ether, or the like, under effective conditions to provide the iodine-containing polyester polymer.

Preferably, the crosslinkable polymer of the invention will have a weight average molecular weight (Mw) of 1,000 to 10,000,000 grams per mole (g/mol), more typically 2,000 to 10,000 g/mol, and a number average molecular weight (Mn) of 500 to 1,000,000 g/mol. Molecular weights (either Mw or Mn) are suitably determined by gel permeation chromatography (GPC).

The coating composition further includes a crosslinker. The crosslinker of the invention may be a small molecule crosslinking agent or a polymeric crosslinking agent such as an iodine-containing poly(meth)acrylate polymer. At least one of the crosslinkable polymer and the crosslinker includes an iodine-containing polymer. As used herein, "an iodine-containing polymer" refers to an iodine-containing polyester polymer or an iodine-containing poly(meth)acrylate polymer.

In an aspect, the crosslinker includes an iodine-containing poly(meth)acrylate polymer that is derived from a monomer of Formula (3):

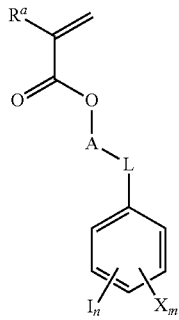

(3)

In Formula (3), $R^a$ is hydrogen, fluorine, a cyano group, a $C_{1-10}$ alkyl group, or a $C_{1-10}$ fluoroalkyl group, with hydrogen being typical.

It is to be understood that "I" in Formula (3) is an iodine atom. In Formula (3), m is an integer of 0 to 4, typically 0 or 1; n is an integer of 1 to 3; and the sum of m and n is less than 6, typically an integer from 1 to 4, or 1 to 3, or 2 to 3.

In Formula (3), L is —O—, —O(C=O)—, —(C=O)O—, —O(SO$_2$)—, —(SO$_2$)O—, —NH(SO$_2$)—, —(SO$_2$)NH—, —NH(CO)—, —(CO)NH—, —SO$_2$—, or —SO—. Preferably, L is —O—, —O(C=O)—, or —(C=O)O—.

In Formula (3), A is an unsubstituted or substituted $C_{1-30}$ alkylene group, an unsubstituted or substituted $C_{3-30}$ cycloalkylene group, an unsubstituted or substituted $C_{1-30}$ heterocycloalkylene group, an unsubstituted or substituted $C_{6-30}$ arylene group, an unsubstituted or substituted divalent $C_{7-30}$ arylalkyl group, an unsubstituted or substituted $C_{1-30}$ heteroarylene group, or an unsubstituted or substituted divalent $C_{3-30}$ heteroarylalkyl group. Preferably, A is an unsubstituted or substituted $C_{1-30}$ alkylene group, for example a $C_{1-10}$ alkylene group substituted with a hydroxyl group.

In Formula (3), each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group. Of these, a hydroxyl group is preferred.

Suitable structures for the monomer of Formula (3) include, for example, the following:

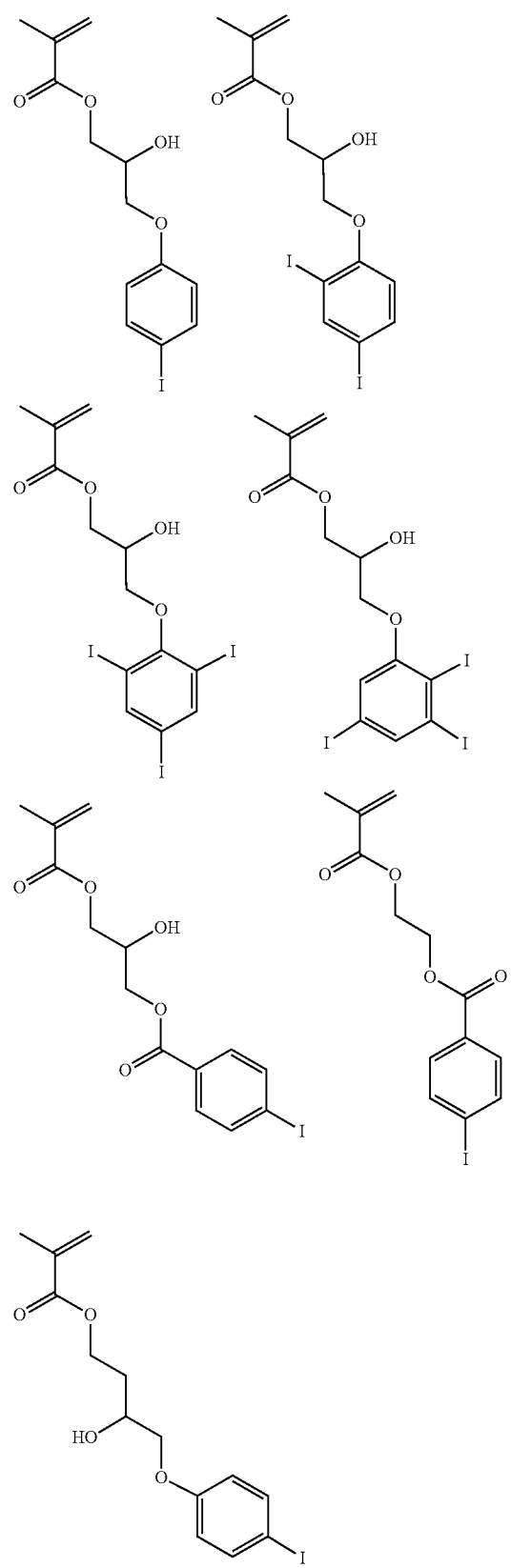

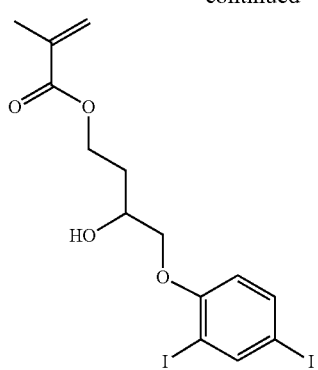
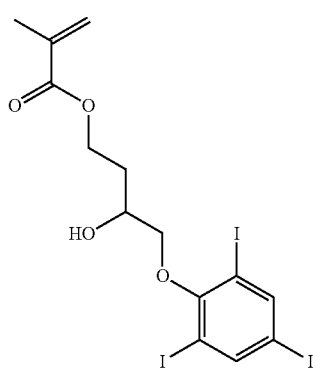
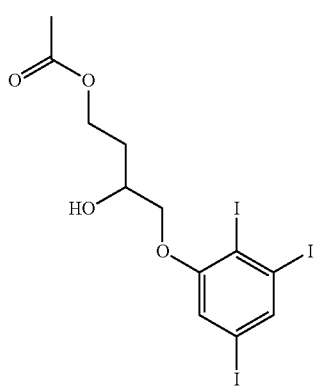
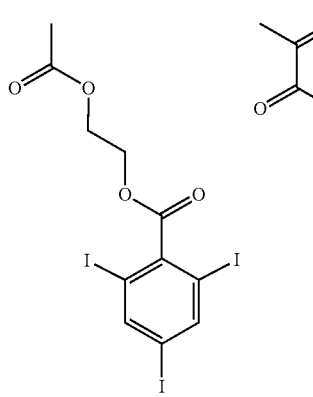
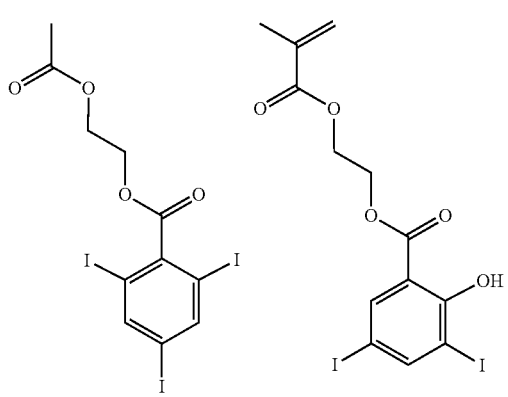
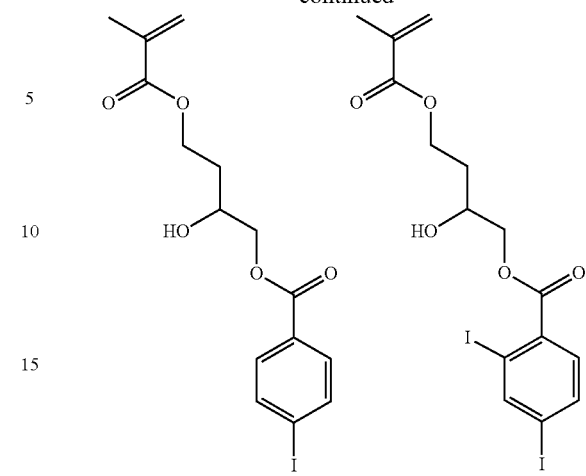
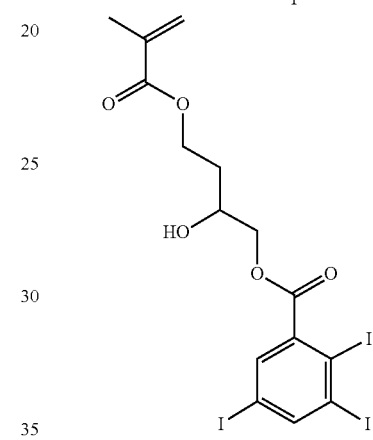
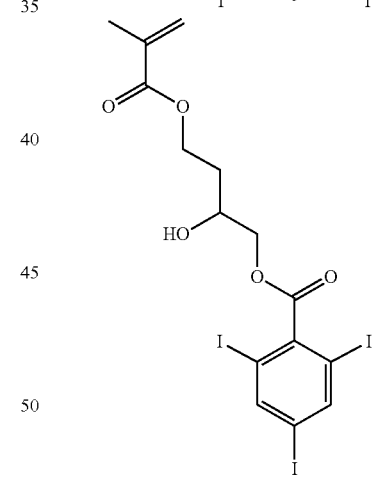
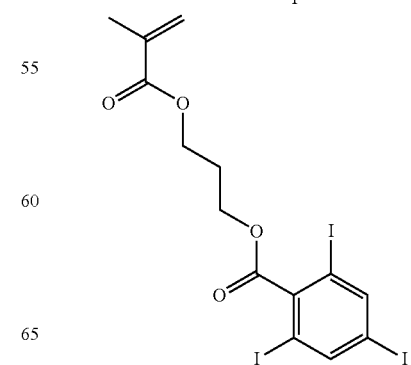

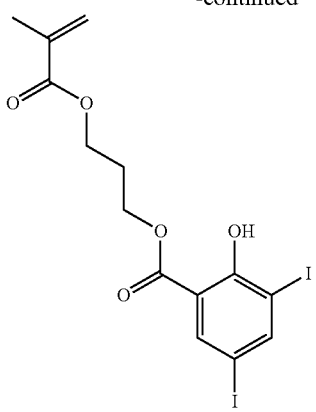

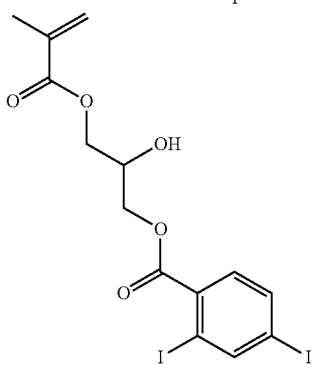

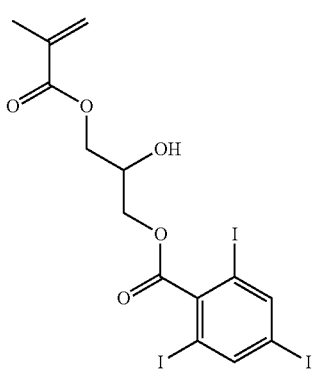

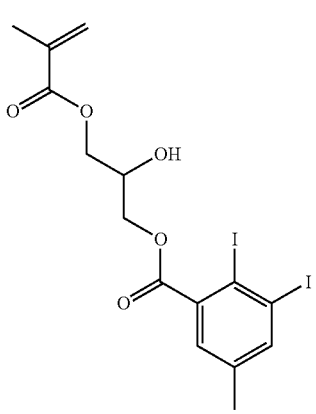

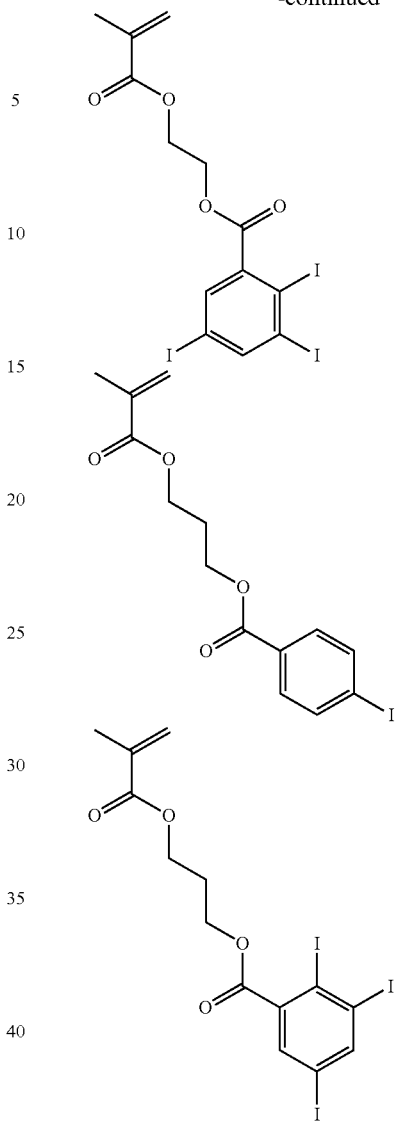

The iodine-containing poly(meth)acrylate polymer can be a homopolymer having units derived from the monomers of Formula (3), can be a copolymer having different units derived from different monomers of Formula (3), or can be a copolymer having additional units other than those derived from the monomers of Formula (3).

In some aspects, the iodine-containing poly(meth)acrylate polymer can be derived from an iodine-containing monomer that further includes a crosslinkable group, such as a hydroxyl group. In another aspect, the iodine-containing poly(meth)acrylate polymer further may comprise a structural unit derived from a crosslinking monomer (i.e., "crosslinking unit"), which is a co-monomer that does not contain iodine. Suitable crosslinking monomers or crosslinking units are those having substituents that are reactive with the crosslinkable groups of the polyester polymer and the iodo-containing polyester polymer, and may include units having pendant hydroxyl groups, thiol groups, epoxy groups, or the like. Exemplary structural units providing crosslinking functionality, which are referred to as crosslinking units, include the following:

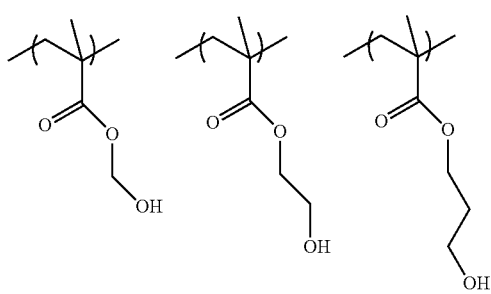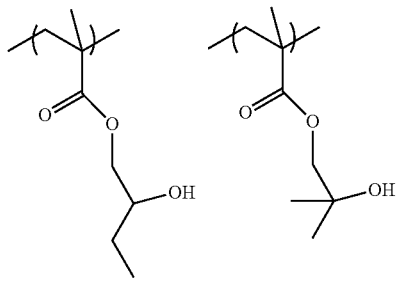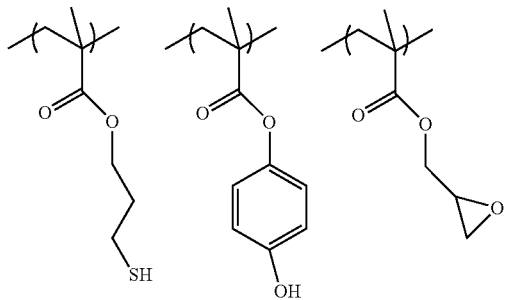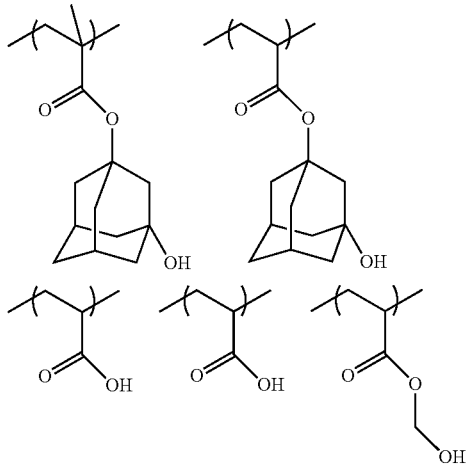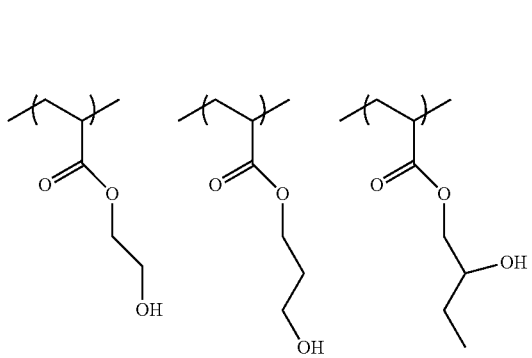
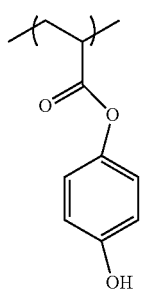
Preferably, the crosslinking monomer includes an epoxy group. Exemplary iodine-containing poly(meth)acrylate polymers that include an epoxy crosslinking unit are the following:
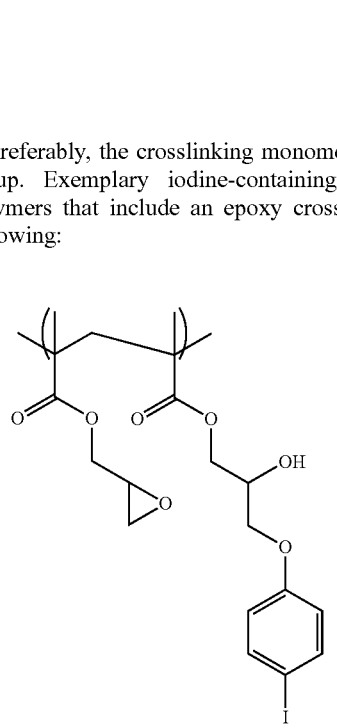
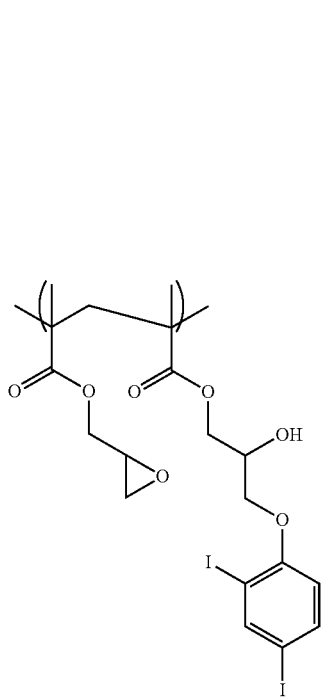

-continued
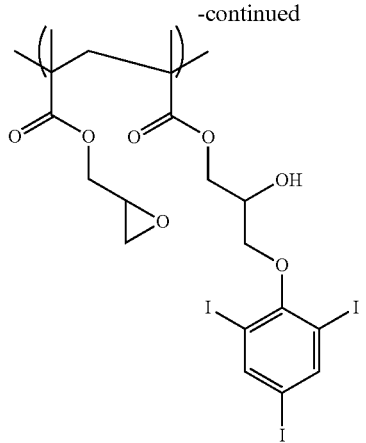
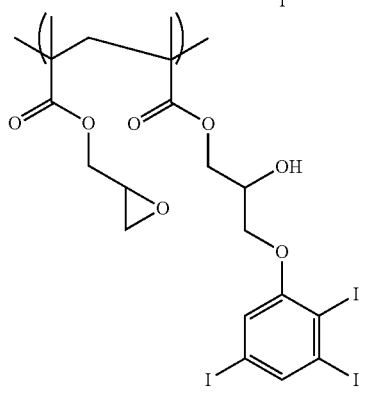
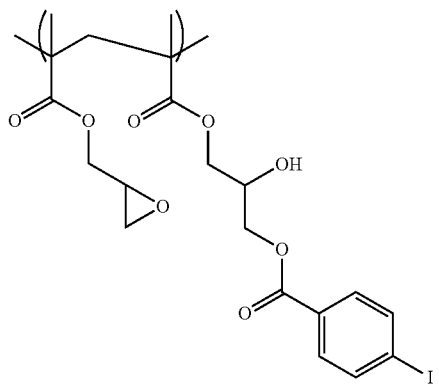
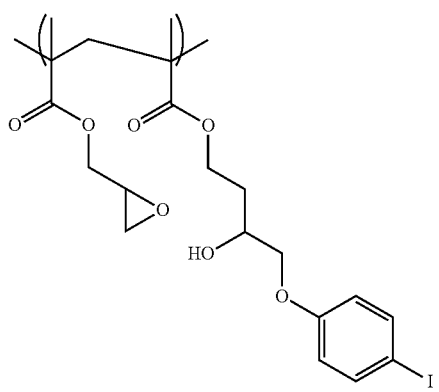
-continued
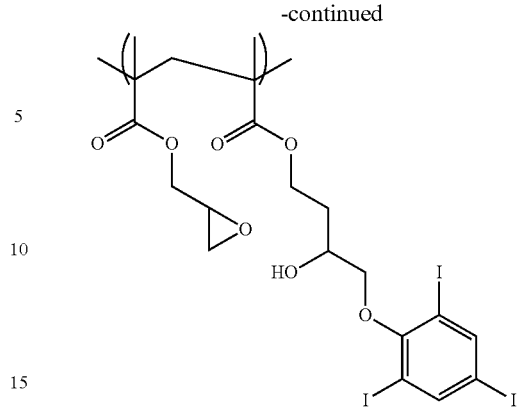
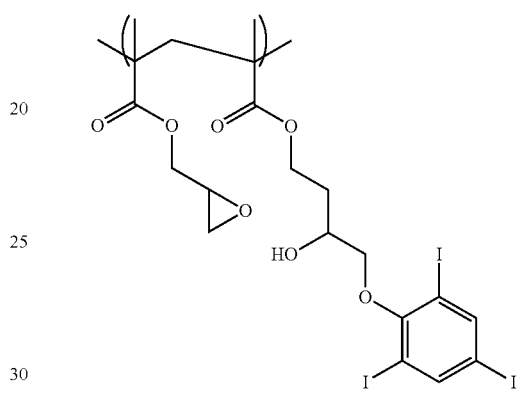
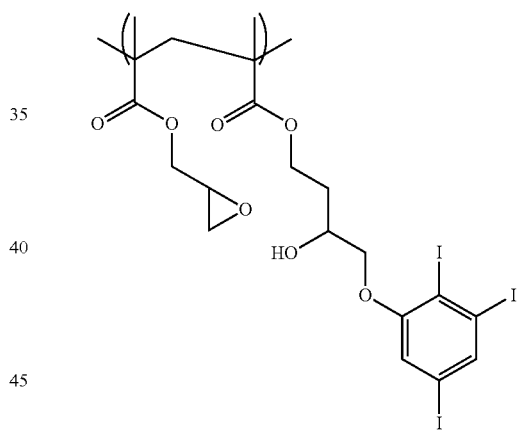
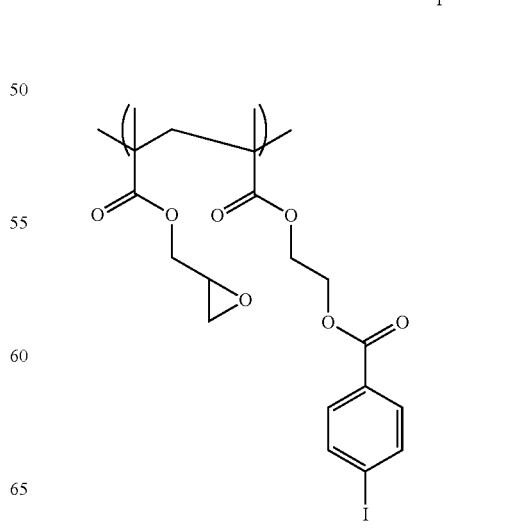

-continued
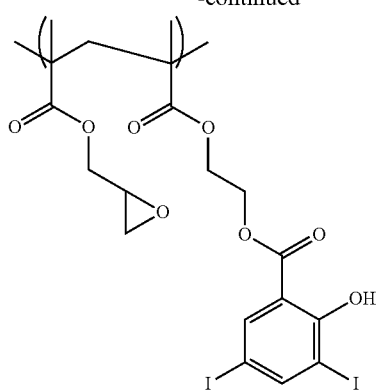
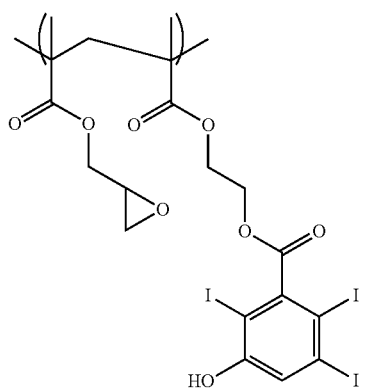
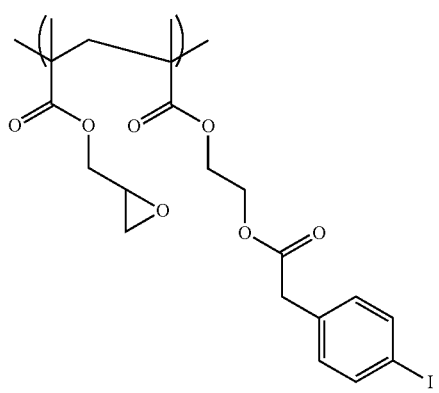
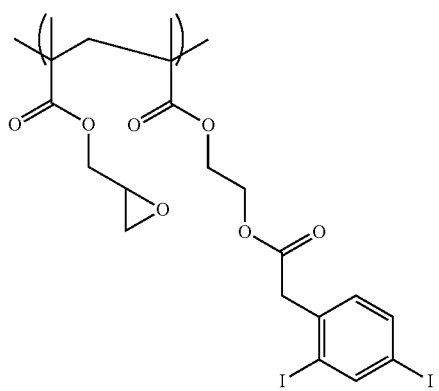
-continued
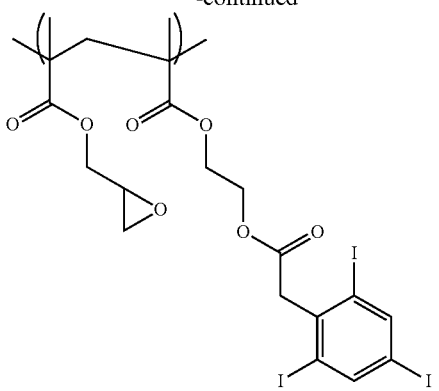
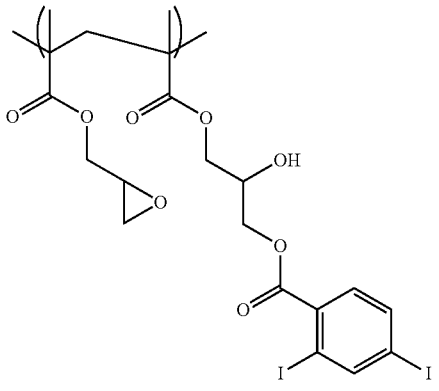
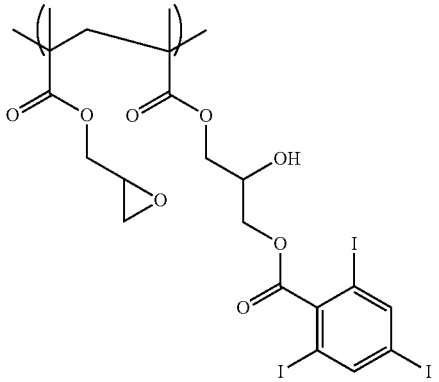
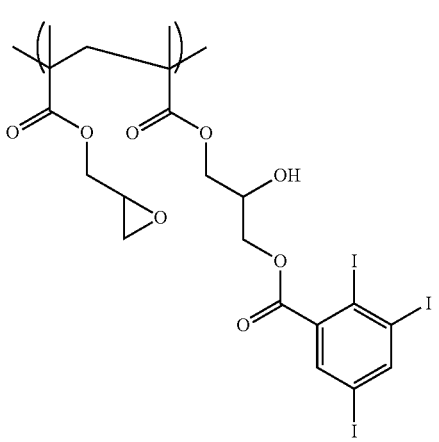

-continued

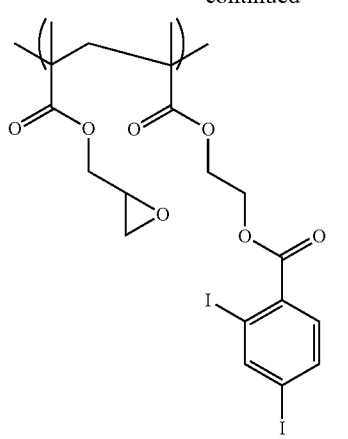

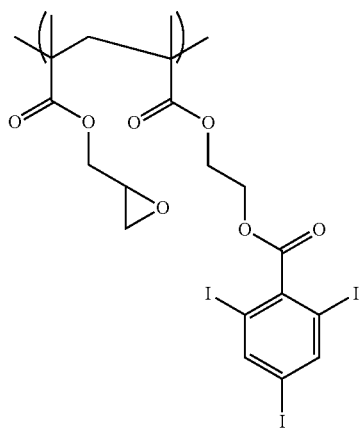

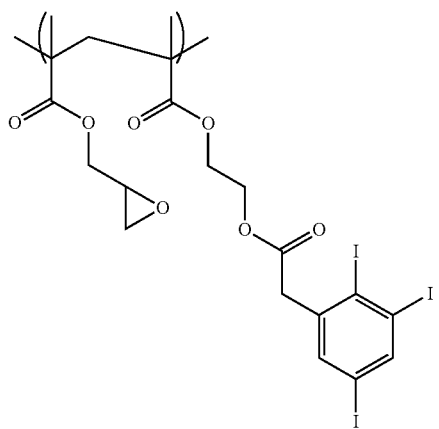

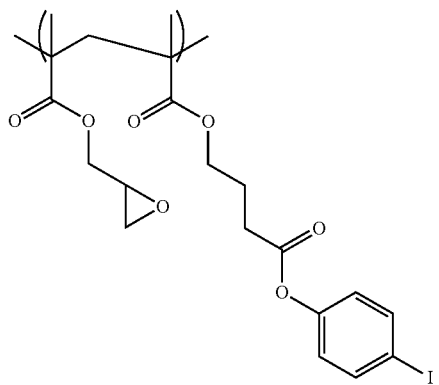

-continued

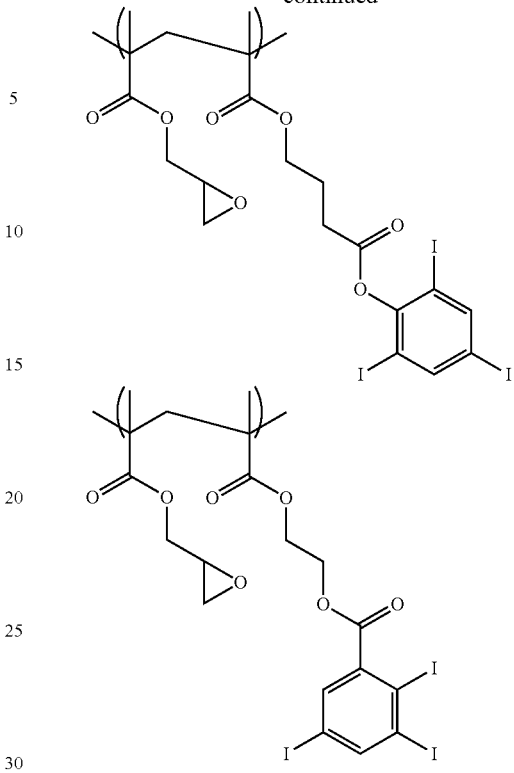

In an aspect, the iodine-containing poly(meth)acrylate polymer may include 10 to 99 mol %, or 30 to 99 mol %, or 80 to 98 mol % of a repeating unit derived from Formula (3) and 1 to 90 mol %, or 1 to 70 mol %, or 2 to 20 mol % of a crosslinking unit, based on the iodine-containing poly(meth)acrylate polymer. In another aspect, the iodine-containing poly(meth)acrylate polymer may include 10 to 90 mol %, preferably 20 to 60 mol % of a repeating unit derived from Formula (3) and 10 to 90 mol %, preferably 40 to 80 mol % of a crosslinking unit, based on the iodine-containing poly(meth)acrylate polymer.

The iodine-containing poly(meth)acrylate polymer may include other repeating structural units different from the monomers of Formula (3) and the crosslinking units. Other repeating structural units may include, for example, one or more additional units for purposes of adjusting properties of the coating composition, such as etch rate and solubility. Exemplary additional units may include one or more of (meth)acrylate for solubility; vinyl ether, vinyl ketone, and vinyl ester for faster etch rate; preferably without crosslinkable groups on the sidechain. The one or more additional units if present in the amine-containing polymer may be used in an amount of up to 69 mol %, preferably from 5 to 50 mol %, based on the amine-containing polymer.

The polymeric crosslinkers, such as the iodine-containing poly(meth)acrylate polymer, may be prepared using any method in the art. For example, one or more monomers corresponding to the structural units described herein and including a polymerizable group may be combined as a monomer composition and the monomers subsequently polymerized to form the polymer. Exemplary polymerizable groups include, but are not limited to, (meth)acrylate, glycidyl ether, N-vinyl, vinylether, vinylester, vinylamide, styrene, (meth)acrylamide, cyanoacrylate, 1,3-diene, vinylcarbonate, vinylcarbamate, maleimide, alpha-olefin, itaconic acid, vinylsilane, alkoxysilane, halosilane, alkynyl, and the like. The iodine-containing poly(meth)acrylate polymer may be obtained by polymerization of the monomer composition under any suitable conditions, for example by heating at an effective temperature, irradiation with actinic radiation at an effective wavelength, or a combination thereof. The monomer composition may further include additives, such as a solvent, a polymerization initiator, a curing catalyst, and the like.

Examples of such solvents include, but are not limited to: hydrocarbons, such as alkanes, fluorinated hydrocarbons, and aromatic hydrocarbons, ethers, ketones, esters, alcohols, and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methyl isobutyl ketone, diisobutylketone, propyleneglycol monomethyl ether, decanol, and t-butanol.

The iodine-containing poly(meth)acrylate polymer may have a weight average molecular weight ($M_w$) of 1,000 to 100,000 grams per mole (g/mol), preferably 2,000 to 50,000 g/mol, more preferably 2,500 to 25,000 g/mol, even more preferably 3,000 to 20,000 g/mol. Molecular weight may be determined by gel permeation chromatography (GPC). Preferable molecular weights will allow for higher yields during synthesis and lower swelling/higher stripping resistance to solvents with which the coating compositions come into contact in use, for example, solvents used in gap filling, underlayer coating, bottom antireflective coating (BARC), photoresist, and developer materials. Higher swelling/lower stripping resistance may result in pattern collapse during patterning of the overcoated photoresist.

The polydispersity index (PDI) of the iodine-containing poly(meth)acrylate polymer is not particularly limited. In an aspect, the PDI is 1.05 or greater, preferably 1.05 to 2.0, more preferably 1.2 to 2.0.

Other crosslinkers that do not contain iodine are any which undergo acid-catalyzed crosslinking with the crosslinkable polymer. Crosslinkers useful in the present invention include, for example: trivinylbenzene, divinyltoluene; divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane), tetra($C_1$-$C_8$) alkoxyglycoluril such as tetramethoxyglycoluril and tetrabutoxyglycoluril, and combinations thereof.

Acid catalysts useful in the present invention include free acids and acid generators. Any free acid which is compatible with the compositions of the present invention and catalyzes crosslinking of the crosslinkable polymer and the crosslinker is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid. The coating composition may include a one catalyst or may include two or more different acid catalysts.

The acid catalyst may be a thermal acid generator (TAG), which is a compound that is capable of generating an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g. phenyl, napthyl, anthracenyl, etc.) and heteroaryl (e.g. thienyl) sulfonate salts, aliphatic sulfonate salts and benzenesulfonate salts. Compounds that generate a sulfonic acid upon activation are generally suitable. Preferred thermal acid generators include p-toluenesulfonic acid ammonium salts and fluorinated derivatives thereof. In an embodiment, the acid catalyst comprises N-benzyl-N,N-dimethylammonium trifluoromethanesulfonate.

The acid catalyst may be a photoacid generator (PAG), which is a compound that is capable of generating an acidic moiety when exposed to activating radiation. Suitable photoacid generators include, for example, sulfide and onium type compounds. Photoacid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, (4-tbutylphenyl)tetramethylenesulfonium (3-hydroxyadamantanyl ester)-tetrafluoro-butanesulfonate), (4-tbutylphenyl)tetramethylenesulfonium (adamantanyl ester)-tetrafluoro-butanesulfonate) and dibutylnaphthylsulfonium triflate. Preferred PAGs include tetramethylenesulfonium compounds.

Suitable photoacid generators for use in a coating composition include photoacid generators disclosed herein for an overcoated photoresist composition. See U.S. Pat. No. 6,261,743 for a discussion of such use of a photoacid generator in an underlying coating composition. For example, the photoacid generator may be a small molecule compound of Formula (4):

$$G^+ Z^- \quad (4)$$

wherein G if of Formula (5):

In Formula (5), X may be S or I. Each $R^0$ is attached to X and may independently be a $C_{1-30}$ alkyl group; a polycyclic or monocyclic $C_{3-30}$ cycloalkyl group; a polycyclic or monocyclic $C_{6-30}$ aryl group; or a combination comprising at least one of the foregoing. r5 may be 2 or 3, provided that when X is I, r5 is 2, and when X is S, r5 is 2 or 3. In Formula (4), Z may include the anion of a sulfonic acid, a sulfonimide, or a sulfonamide.

For example, cation $G^+$ may be of Formulae (6), (7), or (8):

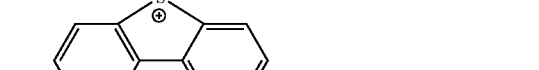

wherein X is I or S, $R^h$, $R^i$, $R^j$, and $R^k$ are unsubstituted or substituted and are each independently hydroxy, nitrile, halogen, $C_{1-30}$ alkyl, C-30 fluoroalkyl, $C_{3-30}$ cycloalkyl, C-30 fluorocycloalkyl, $C_{1-30}$ alkoxy, $C_{3-30}$ alkoxycarbonylalkyl, $C_{3-30}$ alkoxycarbonylalkoxy, $C_{3-30}$ cycloalkoxy, $C_{5-30}$ cycloalkoxycarbonylalkyl, $C_{5-30}$ cycloalkoxycarbonylalkoxy, $C_{1-30}$ fluoroalkoxy, $C_{3-30}$ fluoroalkoxycarbonylalkyl, $C_{3-30}$ fluoroalkoxycarbonylalkoxy, $C_{3-30}$ fluorocycloalkoxy, $C_{5-30}$ fluorocycloalkoxycarbonylalkyl, $C_{5-30}$ fluorocycloalkoxycarbonylalkoxy, $C_{6-30}$ aryl, $C_{6-30}$ fluoroaryl, $C_{6-30}$ aryloxy, or $C_{6-30}$ fluoroaryloxy, each of which is unsubstituted or substituted; $Ar^1$ and $Ar^2$ are independently $C_{10-30}$ fused or singly bonded polycyclic aryl groups; $R^1$ is a lone pair of electrons where X is I, or a $C_{6-20}$ aryl group where X is S; p is an integer of 2 or 3, wherein when X is I, p is 2, and where X is S, p is 3, q and r are each independently an integer from 0 to 5, and s and t are each independently an integer from 0 to 4.

In Formulae (6), (7), and (8), at least one of $R^h$, $R^i$, $R^j$, and $R^k$ may be an acid-cleavable group. In an aspect, the acid-cleavable group may be (i) a tertiary $C_{1-30}$ alkoxy (for example, a tert-butoxy group), a tertiary $C_{3-30}$ cycloalkoxy group, a tertiary C-30 fluoroalkoxy group, (ii) a tertiary $C_{3-30}$ alkoxycarbonylalkyl group, a tertiary $C_{5-30}$ cycloalkoxycarbonylalkyl group, a tertiary $C_{3-30}$ fluoroalkoxycarbonylalkyl group, (iii) a tertiary $C_{3-30}$ alkoxycarbonylalkoxy group, a tertiary $C_{5-30}$ cycloalkoxycarbonylalkoxy group, a tertiary $C_{3-30}$ fluoroalkoxycarbonylalkoxy group, or (iv) a $C_2$-30 acetal group including moiety —O—C($R^{11}R^{12}$)—O— (wherein $R^{11}R^{12}$ are each independently hydrogen or a $C_{1-30}$ alkyl group).

The coating composition may further include any suitable solvent or mixtures of solvents. Suitable solvents include, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

The concentration of the dry components in the solvent will depend on several factors such as the method of application. In general, the total solids content of the coating composition may be from 0.1 to 20 wt % of the total weight of the coating composition, preferably the total solids content of the coating composition may be from 0.1 to 5 wt % of the coating composition.

The amount of crosslinkable polymer in the coating composition may be from 55 to 98.9 wt %, for example, from 60 to 90 wt %, based on total solids of the coating composition.

The amount of crosslinker in the coating composition may be from 1 to 40 wt %, for example, from 3 to 20 wt %, based on total solids of the coating composition.

The amount of the acid catalyst in the coating composition may be from 0.1 to 5 wt %, preferably 0.1 to 3 wt %, for example, 0.4 to 3 wt % or 0.2 to 2 wt %, based on total solids of the coating composition.

For example, the coating composition may include 55 to 98.9 wt % of the crosslinkable polymer, 1 to 40 wt % of the crosslinker, and 0.1 to 5 wt % of the acid catalyst, each based on total solids of the coating composition.

In a preferred embodiment, the coating composition includes 55 to 95 wt % of an iodine-containing polyester polymer; 4 to 25 wt % of an iodine-containing poly(meth) acrylate polymer that includes 10 to 90 mol %, preferably 20 to 60 mol % of a repeating unit derived from Formula (3), and 10 to 90 mol %, preferably 40 to 80 mol % of a crosslinking unit, based on the iodine-containing poly(meth) acrylate polymer; and 0.1 to 20 wt %, preferably 0.3 to 15 wt % of an acid catalyst, each based on total solids of the coating composition.

Optionally, the coating composition may include one or more additives including, for example, surfactants and antioxidants. Such optional additives, if used, are each typically present in the coating composition in minor amounts such as from 0.01 to 10 wt %, based on total solids of the coating composition.

Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL™ and DYNOL™. Additional suitable surfactants include other polymeric compounds such as the tri-block EO-PO-EO co-polymers PLURONIC™ 25R2, L121, L123, L31, L81, L101 and P123 (BASF, Inc.).

An antioxidant can be added to prevent or minimize oxidation of organic materials in the coating composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl·hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butyl·anilino)2,4-bis·octyl-thio-1,3,5-triazine, n-octadecyl-3-(4'-hydroxy-3', 5'-di-tert-butyl·phenyl)propionate, octylated phenol, aralkyl-substituted phenols, alkylated p-cresol and hindered phenol; bis-, tris- and poly-phenols such as 4,4'-dihydroxy·diphenyl, methylene·bis(dimethyl-4,6-phenol), 2,2'-methylene-bis-(4-methyl-6-tert-butylphenol), 2,2'-methylene-bis-(4-methyl-6-cyclohexyl·phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl·diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The coating compositions may be subjected to purification steps prior to being disposed on a substrate. Purification may involve, for example, centrifugation, filtration, distillation, decantation, evaporation, treatment with ion exchange beads, and the like.

The coating composition may be applied as a layer to the substrate by any suitable method including spin-coating, dipping, roller-coating or other conventional coating technique. Preferably, the coating composition is applied by spin coating. For spin-coating, the solids content of the coating composition may be adjusted to provide a desired film thickness based upon the specific coating equipment utilized, the viscosity of the solution, the speed of the coating tool and the amount of time allowed for spinning. The coating composition is generally applied on a substrate with a dried layer thickness of 0.02 and 0.5 micrometers (m), preferably a dried layer thickness of 0.04 and 0.20 m.

Substrates may be any dimension and shape, and are preferably those useful for photolithography, such as silicon, silicon dioxide, silicon-on-insulator (SOI), strained silicon, gallium arsenide, and coated substrates. The substrate may include one or more layers. The layers contained in the substrate may be one or more conductive layers of aluminum, copper, molybdenum, manganese, iron, nickel, copper, zinc, palladium, silver, cadmium, tantalum, titanium, tungsten, platinum, mercury, or alloys thereof, nitrides or silicides; doped amorphous silicon or doped polysilicon; a dielectric layer such as a layer of silicon oxide, silicon nitride, a silicon oxynitride, or a metal oxide; a semiconductor layer such as single-crystal silicon; a glass layer; a quartz layer; or combinations or mixtures thereof, but are not limited thereto. Preferably, the uppermost layer of the substrate, or the outermost layer of the substrate, includes (for example, is coated with) a soft metal such as manganese, iron, nickel, copper, zinc, palladium, silver, cadmium, tantalum, tungsten, platinum, mercury, or alloys thereof. Each layer may be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

In an aspect, the uppermost layer of the substrate includes a resist relief image that defines gaps to be filled. The gaps to be filled may be present in the base substrate material itself or in a layer formed over the base substrate material and may take various forms. The gaps may, for example, take the form of trenches or holes and, preferably may be narrow in width and having high aspect ratios. Accordingly, in some aspects the composition is a gap-fill composition.

The resist relief image typically is formed by a lithographic process, for example, a photolithographic or assembly process such as directed assembly (DSA). An etching process such as an anisotropic dry etch is typically used for pattern transfer to an underlying layer from which the resist relief image and gaps are formed. The gaps may take the form, for example, of holes, trenches or spaces between lines or other surface features. For example, the gaps may extend completely through the material layer from which the resist relief image is formed, exposing the underlying substrate. It may be preferable that the gaps extend only partially through the material layer. In the case of a photolithography process, it is preferable to use an exposure radiation less than 300 nm, such as 248 nm, 193 nm, or an EUV wavelength (e.g., 13.4 or 13.5 nm), or electron beam exposure. The gaps may take the form, for example, of trenches or holes having a height h and a width w, and may be of relatively narrow width and large height. Processes and compositions in accordance with the disclosure are suitable for use in the filling of gaps having relatively high aspect ratios. As used herein, aspect ratio (AR) is defined as AR=h/w, wherein h is the gap height and w is the gap width. Typically, the gap width is from 1 nm to 200 nm, for example, 1 nm to 100 nm, 1 nm to 50 nm, 1 nm to 25 nm or from 1 to 10 nm, and is preferably less than 50 nm, for example, less than 20 nm, less than 15 nm, less than 10 nm, or less than 5 nm. The aspect ratio is typically from 1 to 20, for example, from 2 to 20 or from 5 to 20.

After being applied on the substrate, the composition is optionally softbaked at a relatively low temperature to remove any solvent and other relatively volatile components from the composition layer. Typically, the substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate.

The applied composition may be optionally thermally treated prior to overcoating with another composition or layer. Such thermal treatment may cause hardening including crosslinking of the composition. Such crosslinking may include hardening and/or covalent-bonding forming reactions between one or more composition components and may modulate water contact angle of the coating composition layer. For example, the applied composition layer may be cured after being disposed on the substrate. Cure conditions will vary with the components of the composition. Cure conditions may render the composition coating layer substantially insoluble to the solvent used to apply subsequent layer(s) as well as an alkaline aqueous developer solution.

For example, the composition layer may be sufficiently cured such that the layer does not intermix with a subsequently applied layer, such as a photoresist or other organic layer disposed directly on the underlayer. The composition layer may be cured in an oxygen-containing atmosphere, such as air, or in an inert atmosphere, such as nitrogen and under conditions, such as heating, sufficient to provide a cured coating layer. Exemplary curing is by heating the composition layer at a curing temperature of 150° C. or greater, and preferably 150 to 450° C. It is more preferred that the curing temperature is 180° C. or greater, still more preferably 200° C. or greater, and even more preferably from 200 to 400° C. When a thermal acid generator is used, the curing temperature should be sufficient for the thermal acid generator to liberate acid to aid in curing of the composition. The curing time may be from 10 seconds to 10 minutes, preferably from 30 seconds to 5 minutes, more preferably from 45 seconds to 5 minutes, and stilly more preferably from 45 to 90 seconds. The curing temperature may be selected based on the desired curing rate to achieve a cured composition layer.

The initial baking step may not be necessary if the curing step is conducted in such a way that rapid evolution of the solvents and curing by-products is not allowed to disrupt the film quality. For example, a ramped bake beginning at relatively low temperatures and then gradually increasing to the range of 200 to 325° C. may give acceptable results. It may be preferable in some cases to have a two-stage curing process, with the first stage being a lower bake temperature of less than 200° C., and the second stage being a higher bake temperature preferably between 200 and 400° C. Two stage curing processes facilitate uniform filling and planarization of pre-existing substrate surface topography, for example filling of trenches and vias.

After curing of the composition layer, one or more processing layers, such as a photoresist layer, a silicon-containing layer, a hardmask layer, a BARC layer, and the like, may be disposed on the cured underlayer. As used herein, an "organic layer" refers to an organic BARC layer. For example, a photoresist may be disposed, such as by spin coating, directly on the surface of the cured underlayer. Alternatively, the cured coating layer may be used as the bottom layer of a multilayer resist process, where one or more additional layers may be disposed between the cured coating layer and the photoresist layer. In such a process, a layer of the underlayer coating composition is disposed on a substrate and cured as described above to form a coating layer (i.e., the cured underlayer). Next, one or more additional layers are disposed on the coating layer. For example, a silicon-containing layer or a hardmask layer is disposed directly on the coating layer. Exemplary silicon-containing layers include a silicon-BARC, which may be spin coated on the underlayer followed by curing, or an inorganic silicon layer such as SiON or $SiO_2$, which may be deposited on the coating composition layer by chemical vapor deposition (CVD). Any suitable hardmask may be used and may be deposited on the coating layer by any suitable technique and cured as appropriate. Optionally, an organic BARC layer may be disposed directly on the silicon-containing layer or hardmask layer, and appropriately cured.

The photoresist is disposed directly on the cured underlayer, directly on the silicon-containing layer (in a trilayer process), or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the coating layer is then patterned using appropriate etching techniques, such as $O_2$ plasma. Any remaining patterned photoresist and organic BARC layers are removed during etching of the coating layer. Next, the pattern is then transferred to the substrate, such as by appropriate etching techniques, which also removes any remaining silicon-containing layer or hardmask layer, followed by removal of any remaining patterned coating layer to provide a patterned substrate.

The photoresist composition is formed as a photoresist layer on the corresponding underlayer(s). For example, the photoresist composition may be applied directly to the composition layer, or there may be one or more interlayers sandwiched between the composition layer and the photoresist layer. The photoresist composition may include a matrix polymer, a photoacid generator, and a solvent.

The matrix polymer may include at least one unit having an acid-cleavable protecting group. The acid-cleavable protecting group may be, for example, acetal or ester groups that contain a tertiary non-cyclic alkyl carbon (for example, t-butyl) or a tertiary alicyclic carbon (for example, methyladamantyl) covalently linked to a carboxy oxygen of an ester of the matrix polymer. Suitable units which may be included in the matrix polymer may be, for example, units derived from (alkyl)acrylate, for example, units derived from acid-cleavable (alkyl)acrylate. Particular examples thereof include units derived from t-butyl acrylate, t-butyl methacrylate, methyladamantyl acrylate, methyl adamantyl methacrylate, ethylfenchyl acrylate, ethylfenchyl methacrylate, and the like. Another example of suitable units which may be included in the matrix polymer may be units derived from a non-aromatic cyclic olefin (endocyclic double bond) such as an optionally substituted norbornene. Still another example of suitable units which may be included in the matrix polymer may be units derived from anhydrides, for example, maleic anhydride, itaconic anhydride, and the like. Also, the matrix polymer may contain units that contain a heteroatom such as oxygen and sulfur, and, for example, a heterocyclic unit may be fused to the main chain of the matrix polymer. The matrix polymer may be used as a blend of two or more kinds. The matrix polymer may be commercially available or prepared by those skilled in the art. The matrix polymer of the photoresist composition is used in an amount sufficient to render an exposed coating layer of the photoresist developable with a suitable solution, for example, 50 to 95 wt %, based on total solids of the photoresist composition. The weight average molecular weight ($M_w$) of the matrix polymer may be less than 100,000 g/mol, for example, from 5,000 to 100,000 g/mol, for example, 5,000 to 15,000 g/mol.

The photoresist composition may further include a photoactive material employed in an amount sufficient to generate a latent image in a coating layer of the composition upon exposure to activating radiation and may include a photoacid generator. Example photoacid generators include those as described above.

The photoresist composition may include a solvent, for example, glycol ether such as 2-methoxyethyl ether, ethylene glycol monomethyl ether and propylene glycol monomethyl ether; propylene glycol monomethyl ether acetate; lactates such as ethyl lactate and methyl lactate; propionate such as methyl propionate, ethyl propionate, ethyl ethoxy propionate and methyl-2-hydroxyisobutyrate; methyl cellosolve acetate; aromatic hydrocarbon such as toluene and xylene; ketone such as acetone, methyl ethyl ketone, cyclohexanone and 2-heptanone. Such solvents may be used alone or in combination of two or more solvents.

The photoresist composition may be applied on to the underlaying layer(s) by spin coating, dipping, roller coating or other conventional coating technique. For example, spin coating may be used. For the spin coating, the solids content of the coating solution may be adjusted to provide a desired film thickness based upon the specific coating equipment utilized, the viscosity of the solution, the speed of the coating tool and the amount of time allowed for spinning. A thickness of the photoresist composition layer may be, for example, 50 to 300 nm.

The photoresist composition layer may be soft-baked to minimize the solvent content in the layer, thereby forming a tack-free coating and improving adhesion of the layer to the substrate. The soft-bake may be conducted on a hotplate or in an oven. The soft-bake temperature and time will depend on the particular material of the photoresist and thickness. For example, typical soft-bakes are conducted at a temperature of from 90° C. to 150° C. for 30 seconds to 90 seconds.

Additionally, an overcoating layer may be formed on the photoresist composition layer. The overcoating layer may be formed for uniform resist pattern, reduction of reflectance during the exposure process of the resist, improved depth of focus and exposure latitude and reduction in defects. The overcoating layer may be formed by spin coating technique using an overcoating composition. The solids content of the coating solution may be adjusted to provide a desired film thickness based upon the specific coating equipment utilized, the viscosity of the solution, the speed of the coating tool and the amount of time allowed for spinning. A thickness of the overcoating layer may be, for example 200 to 1,000 Angstrom (A). The overcoating layer may be soft-baked to minimize the solvent content in the layer. The soft-bake may be conducted on a hotplate or in an oven. Typical soft-bakes are conducted at a temperature of from 80° C. to 120° C. for 30 seconds to 90 seconds.

The photoresist composition layer is then exposed to activating radiation through a photomask to create a difference in solubility between exposed and unexposed regions. The photomask has optically transparent and optically opaque regions. The exposure wavelength may be, for example, 400 nm or less, 300 nm or less, or 200 nm or less, for example, 248 nm (for example, KrF excimer laser light), 193 nm (for example, ArF excimer laser light), or EUV (13.5 nm). The exposure energy is typically from 10 to 80 millijoules per square centimeter ($mJ/cm^2$), dependent upon the exposure device and the components of the photosensitive composition.

After the exposure step of the photoresist composition layer, a post exposure bake (PEB) is conducted. PEB may be conducted on a hotplate or in an oven. PEB conditions may vary with the components of the photoresist composition layer and thickness. For example, typical PEB is conducted at a temperature of from 80° C. to 150° C. for 30 seconds to 90 seconds. Thus, a latent image is produced in the photoresist composition layer due to difference in solubility between light exposed and unexposed regions.

The overcoating layer and the exposed photoresist composition layer are then developed to remove unexposed regions, thus forming a resist pattern. The developer is typically an organic developer, for example, a solvent selected from ketones, esters, ethers, amides, hydrocarbons, and mixtures thereof. Examples of suitable ketone include acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Examples of suitable ester include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Examples of suitable ether include dioxane, tetrahydrofuran and glycol ether (for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol). Examples of suitable amide include N-methyl-2-pyrrolidone, N,N-dimethylacetamide and N,N-dimethylformamide. Examples of suitable hydrocarbon include aromatic hydrocarbon solvents (for example, toluene and xylene).

The developer may contain a solvent which may be used in the photoresist composition, for example, 2-heptanone, butyl acetate (for example, n-butyl acetate). The developer may contain mixtures of these solvents, or one or more of the listed solvents mixed with a solvent other than those described above or mixed with water. For example, the developer may contain a mixture of a first organic solvent and a second organic solvent. Particular examples of the first organic solvent are $C_4$-$C_9$ ketones; hydroxyalkyl esters such as methyl 2-hydroxyisobutyrate, ethyl lactate; and linear or branched $C_5$-$C_6$ alkoxy alkyl acetate such as propylene glycol monomethyl ether acetate, for example, 2-heptanone or 5-methyl-2-hexanone. Examples of the second organic solvent are linear or branched $C_6$-$C_5$ alkyl esters such as n-butyl acetate, n-pentyl acetate, n-butyl propionate, n-hexyl acetate, n-butyl butyrate and isobutyl butyrate; and linear or branched $C_8$-$C_9$ ketones such as 4-octanone, 2,5-dimethyl-4-hexanone, 2,6-dimethyl-4-heptanone, for example, n-butyl acetate, n-butyl propionate or 2,6-dimethyl-4-heptanone. Examples of combinations of the first and the second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone, 2-heptanone/n-butyl acetate. Of these combinations, 2-heptanone/n-butyl acetate or 2-heptanone/n-butyl propionate may be preferred. The solvent may be present in the developer in an amount of from 90 to 100 wt %, for example, greater than 95 wt %, greater than 98 t %, greater than 99 wt % or 100 wt %.

The developer may also include optional additives, for example, surfactants, and the like. Such optional additives typically will be present in minor concentrations, for example, 0.01 to 5 wt %.

The developer may be applied on to the photoresist composition layer by known techniques, for example, spin coating or puddle coating. The development time is for a period effective to remove the unexposed regions of the photoresist. For example, the development is conducted for 5 to 30 seconds at room temperature. The developed photoresist composition layer may be further cured by performing additional baking at a temperature of 100° C. to 150° C. for several minutes.

The developed substrate may have a substrate region from which a photoresist is removed, and the substrate region may be treated in a selective manner. For example, the substrate region from which the photoresist is removed may be chemically etched or plated using a method well known in the related art. A hydrofluoric acid etching solution, and a plasma gas etching agent such as an oxygen plasma etching agent may be used as an etching agent. For example, the coating composition layer may be removed, and the substrate may be etched using the plasma gas etching agent.

A wet etch process may be suitably employed. Wet etching may be suitably carried out by exposing the surface to be etched (e.g. a metal nitride, or metal nitride coated with one or more organic and/or inorganic layers) with a wet etch composition for a time and temperature effective to etch the surface (e.g. metal nitride surface and/or coating layers thereon). Exemplary wet etching compositions include an aqueous mixture of ammonium hydroxide and a peroxide such as hydrogen peroxide, or a mixture of an acid such as sulfuric acid and a peroxide such as hydrogen peroxide. See US 2006/0226122 for exemplary compositions. The examples which follow also provide exemplary wet etch process conditions. As referred to herein, a "wet etch process" means treating substrate areas defined by an adjoining photoresist (after development of the photoresist image) with a fluid composition typically either acid or alkaline in combination with a peroxide agent, but in any event distinguished from a plasma dry etch.

Alternatively, a dry etch process may be used. Suitable dry etching chemistries include, for example, plasma processing with $O_2$, $CHF_3$, $CF_4$, Ar, $SF_6$, and combinations thereof. Of these, oxygen and fluorinated plasma etching is typical. Optionally, the etching can include a trim etch to further reduce the width of the guide patterns for making finer patterns. The guide patterns typically have a width, for example, of from 1 to 30 nm and a center-to-center pitch of from 5 to 500 nm. This is typical, for example, for a pinning mat layer. If the application is for a neutral mat layer, the guide patterns typically have a width, for example, of from 5 to 300 nm and a center-to-center pitch of from 12 to 500 nm.

When the coating composition is used as a gap-fill composition, further processing of the substrate is conducted to form a final device, which may include a memory (e.g., DRAM) or logic device. The further processing may include, for example, one or more of formation of a layer over the substrate, polishing, chemical-mechanical planarization (CMP), ion implantation, annealing, CVD, PVD, epitaxial growth, electroplating, and lithographic techniques such as DSA and photolithography. Preferably, coating of a liquid layer containing a solvent, for example, by spin-coating, directly over the crosslinked gap-fill composition, may be conducted without intermixing with the underlying crosslinked material.

The above methods and structures may be used in the manufacture of electronic devices, such as semiconductor devices including memory devices requiring dense line/space patterns such as dynamic random access memory (DRAM), synchronous dynamic random access memory (SDRAM) or dense features for data storage such as in hard drives. It will be appreciated that such devices are meant to be illustrative and should not be construed as limited thereto.

The following non-limiting examples are illustrative of the invention.

Examples

Synthesis of Polymers

Polymer 1 (Iodine-Containing Polyester with Crosslinkable Group)

A round bottom flask (RBF) was charged with tris(hydroxyethyl)isocyanurate (THEIC, 12.97 g), tris(carboxyethyl) isocyanurate (TCEIC, 17.15 g), 4-iodobenzoic acid (IBA, 12.32 g), 1,2-propandiol (PD, 7.56 g), propyleneglycol monomethyl ether (PGME, 10.0 g), anisole (50.0 g), p-toluene sulfonic acid (pTSA 0.47 g). The flask was connected to a condenser with a dean-stark trap and a thermometer to measure and control the solution temperature throughout polymerization. The flask was placed in a silicon oil bath with a magnetic stirrer. The reactor temperature was set at 150° C. and maintained for 3 hours. After such time, the reactor was allowed to cool to room temperature while stirring. The polymer solution was precipitated into a tenfold excess of isopropyl alcohol (IPA) and the polymer was recovered by filtration and drying for 24 hours at 40° C. under vacuum. The dried powder was re-dissolved with tetrahydrofuran (THF, 25%) and then precipitated into a ten-fold excess of IPA. The resulting white polymer product was collected by filtration and dried for 24 hours at 40° C. in a vacuum oven.

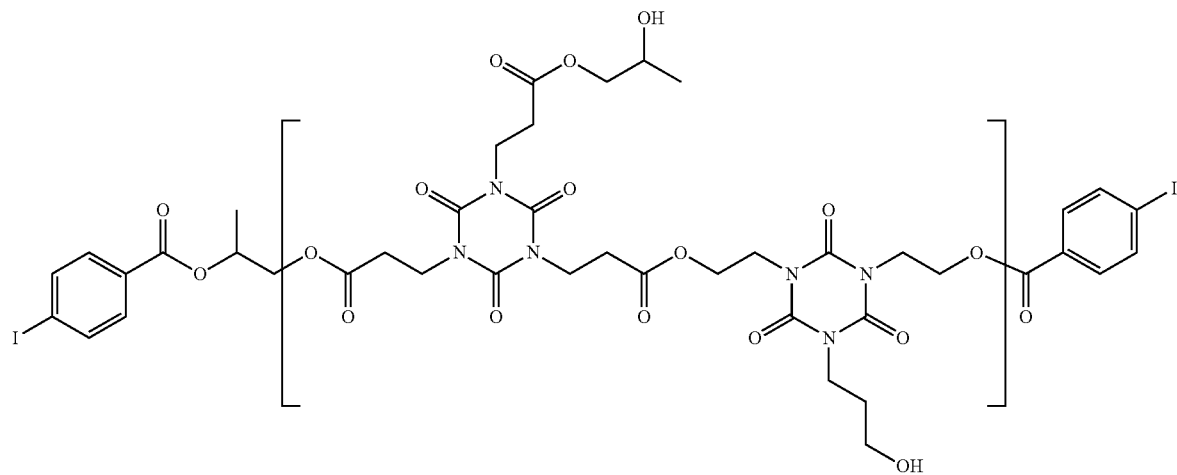
Polymer 1
Polymer 2 (Iodine-Containing Polyester with Crosslinkable Group)
Polymer 2 was prepared by same procedure that was used to prepare Polymer 1, except that 2-(4-iodophenyl)acetic acid (IPAA) was used instead of IBA.
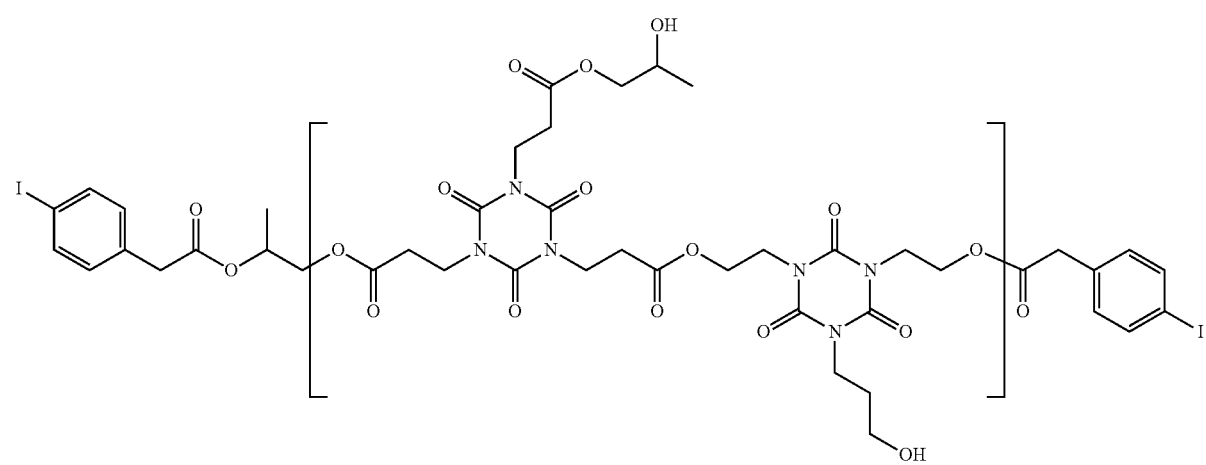
Polymer 2

Polymer 3 (Iodine-Containing Polyester with Crosslinkable Group)

Polymer 3 was prepared by same procedure that was used to prepare Polymer 1, except that diiodosalicylic acid (DIS) was used instead of IBA.

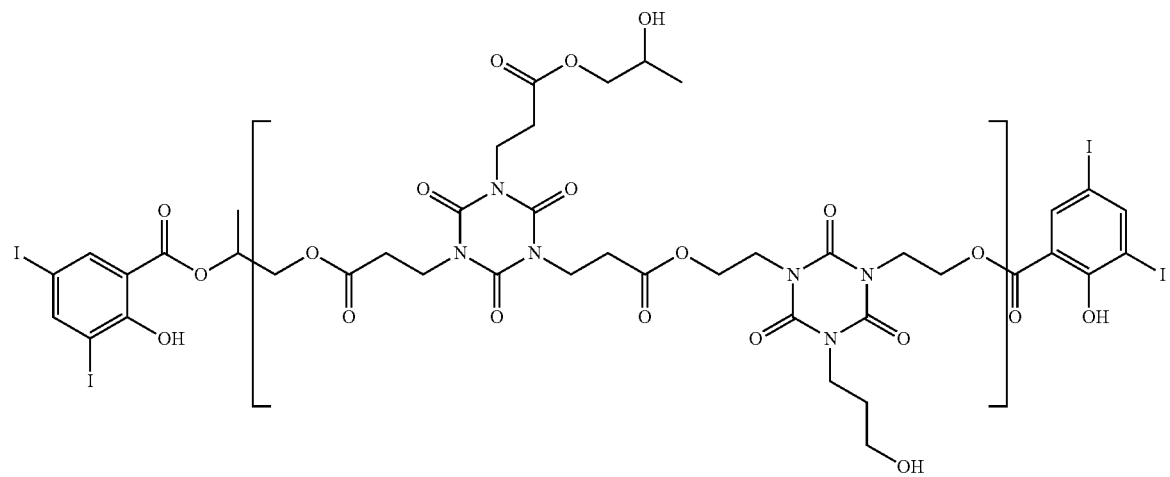

Polymer 3

Polymer 4 (Iodine-Containing Polyester with Crosslinkable Group)

Polymer 4 was prepared by same procedure that was used to prepare Polymer 1, except that triiodobenzoic acid (TIB) was used instead of IBA.

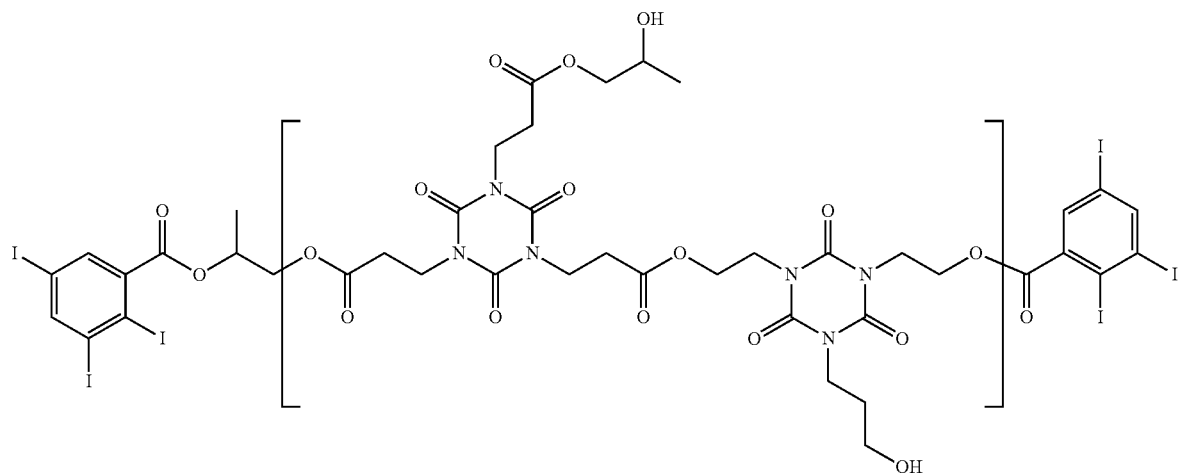

Polymer 4

Polymer 5 (Polyester with Crosslinkable Group)

An RBF equipped with a thermocouple and Dean-Stark condenser was charged with THEIC (30.4 g), TCEIC (20.1 g), n-butanol (20.0 g), p-toluenesulfonic acid (0.5 g), and 34 g of anisole. The RBF was heated in an oil bath at 150° C. with stirring for 3 hours, allowed to cool to room temperature, and then diluted with HBM (160 g). The resulting solution (40 g) was combined with p-toluenesulfonic acid (0.07 g) and 1,3,4,6-tetrakis(methoxymethyl)tetrahydroimidazo[4,5-d]imidazole-2,5(1H,3H)-dione (3.6 g) and heated at 50° C. with stirring for 4 hours. The solution was quenched with triethylamine (0.4 mL) and allowed to cool to room temperature. The product was precipitated with IPA and heptane, collected by filtration, and dried for 24 hours at 40° C. in a vacuum oven.

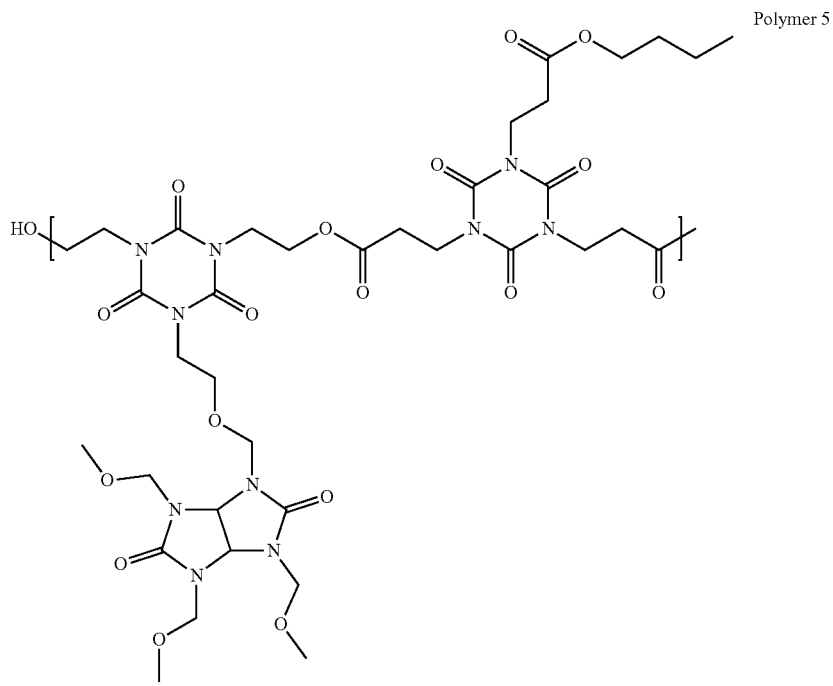

Polymer 5

Polymer 6 (Iodine-Containing Acrylic Polymer with Crosslinkable Group)

An first RBF equipped with a thermocouple and condenser was charged with dimethyl acetamide (30.56 g), glycidyl methacrylate (3.00 g), 4-iodophenol (4.64 g), and tetrabutyl ammonium bromide (0.08 g). The mixture was heated at 80° C. in an oil bath for 18 hours with stirring, and subsequently allowed to cool to room temperature. The product, 2-hydroxy-3-(4-iodophenoxy)propyl methacrylate (HIPPM), was extracted using a combination of ethyl acetate and water, the solvent was removed by evaporation, and the product was dried for 24 hours at 40° C. in a vacuum oven.

A second RBF equipped with a thermocouple and condenser was charged with 60 g of PGMEA and heated at 80° C. in an oil bath. Glycidyl methacrylate (GMA, 25.13 g), HIPPM (9.87 g), dimethyl 2,2'-azobis(2-methylpropionate) (V601, 3.196 g), and 45 g of PGMEA were then introduced into the RBF over the duration of 4 hours. The resulting mixture was stirred for one additional hour and then allowed to cool to room temperature. The product was precipitated with 2-methoxy-2-methylpropane (MTBE, 2,000 g), collected by filtration, and dried for 24 hours at 40° C. in a vacuum oven.

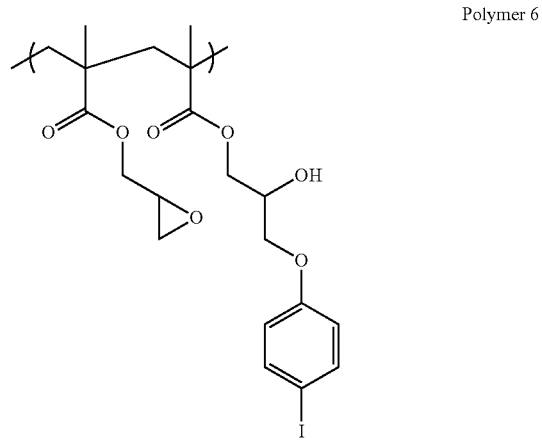

Polymer 6

Polymer 7 (Iodine-Containing Acrylic Polymer with Crosslinkable Group)

Polymer 7 was prepared by same procedure that was used to prepare Polymer 6, except that 2-hydroxy-3-(2,3,5-triiodophenoxy)propyl methacrylate (HTIBM, CAS Reg. No. 173979-81-2) was used instead of HIPPM.

Polymer 7

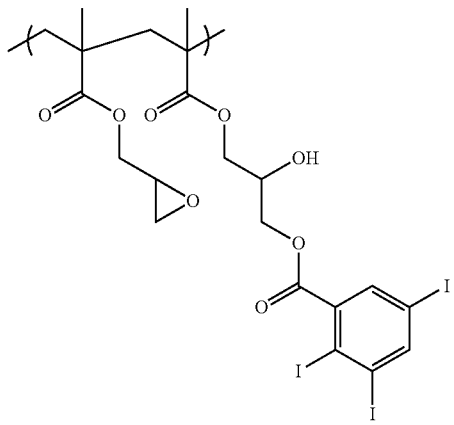

Polymer 8 (Acrylic Polymer with Crosslinkable Group)

An RBF was charged with glycidyl methacrylate (25.0 g), azo initiator (V-59, 3.1 g), and propylene glycol monomethyl ether acetate (85.0 g) and heated at 95° C. for 4 hours. After such time, the reactor was allowed to cool to room temperature while stirring. The product was isolated by precipitation using a ten-fold excess of MTBE, collected by filtration, and dried for 24 hours at 40° C. in a vacuum oven.

Polymer 8

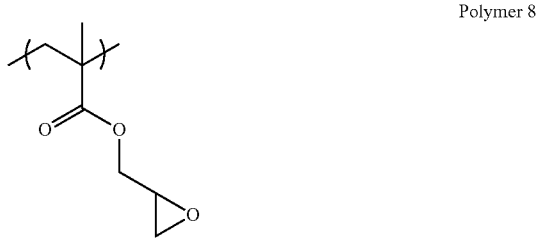

EUV Underlayer Compositions

EUV underlayer compositions were prepared by combining the components in the amounts shown in Table 1. The solutions were filtered through a polytetrafluoroethylene filter having a 0.45 micrometer pore size prior to use.

The following abbreviations are used in Table 1: TMEG is tetramethoxymethyl glycoluril; PGMEA is propylene glycol monomethyl ether acetate; GBL is gamma-butyrolactone; HBM is methyl-2-hydroxy isobutyrate; T1 is N-benzyl-N,N-dimethylammonium trifluoromethanesulfonate salt; MN 4603S is a cresol novolac resin having an $M_w$ of 3,000 g/mol and a PDI of 2.0 (available as MIPHOTO NOVOL 4603S from Miwon Commercial Corp.).

EUV Absorption Coefficients

The EUV absorption coefficients (13.5 nm) for the underlayer compositions of Examples 1 to 9 and Comparative Examples 1 and 2 were calculated based on atomic composition and film density through a public program operated by The Center for X-ray Optics in Lawrence Berkeley National Lab. These results are shown in Table 2.

TABLE 2

| Underlayer Composition | Calculated EUV Absorption Coefficient |
| --- | --- |
| Example 1 | 7.61 |
| Example 2 | 7.58 |
| Example 3 | 7.20 |
| Example 4 | 7.31 |
| Example 5 | 8.20 |
| Example 6 | 8.62 |
| Example 7 | 8.25 |
| Example 8 | 8.49 |
| Example 9 | 8.44 |
| Comparative example 1 | 6.89 |
| Comparative example 2 | 4.97 |

Film Strip Evaluation

The underlayer compositions were separately spin coated on a silicon wafer at 1500 rpm using a spinner and the wafer was heated at 205° C. for 60 seconds using a hot plate to form a thin film (film thickness of 20 nm). The thin film was exposed to 30 mL of PGMEA:HBM (7:3) mixture for 90 seconds and post baked at 110° C. for 60 seconds on a hot plate. Thickness of an initially coated film and an exposed & post baked film was measured, and the change in film thickness (Δstrip) was calculated (thickness of an exposed & post baked film—thickness of an initially coated film). The results are shown in Table 3.

TABLE 3

| Underlayer Composition | Δstrip (nm) |
| --- | --- |
| Example 1 | −0.5 |
| Example 2 | −0.8 |
| Example 3 | −0.9 |
| Example 4 | −0.4 |
| Example 5 | −1.2 |

TABLE 1

| Example | Polymer | Crosslinker | Catalyst | Solvent |
| --- | --- | --- | --- | --- |
| 1 | Polymer 1 (0.22 g) | TMEG (74 mg) | T1 (4.5 mg) | HBM (8.32 g), PGMEA (20.8 g) |
| 2 | Polymer 2 (0.22 g) | TMEG (74 mg) | T1 (4.5 mg) | HBM (8.32 g), PGMEA (20.8 g) |
| 3 | Polymer 5 (0.22 g) | Polymer 6 (74 mg) | T1 (4.5 mg) | HBM (8.32 g), PGMEA (20.8 g) |
| 4 | Polymer 5 (0.22 g) | Polymer 7 (74 mg) | T1 (4.5 mg) | HBM (8.32 g), PGMEA (20.8 g) |
| 5 | Polymer 3 (0.22 g) | Polymer 8 (74 mg) | T1 (4.5 mg) | HBM (8.32 g), PGMEA (20.2 g), GBL (0.6 g) |
| 6 | Polymer 3 (0.16 g) | Polymer 7 (0.16 g) | T1 (4.5 mg) | HBM (8.32 g), PGMEA (20.2 g), GBL (0.6 g) |
| 7 | Polymer 3 (0.22 g) | TMEG (74 mg) | T1 (4.5 mg) | HBM (8.32 g), PGMEA (20.8 g) |
| 8 | Polymer 4 (0.22 g) | TMEG (74 mg) | T1 (4.5 mg) | HBM (8.32 g), PGMEA (20.8 g) |
| 9 | Polymer 4 (0.22 g) | Polymer 8 (74 mg) | T1 (4.5 mg) | HBM (8.32 g), PGMEA (20.2 g), GBL (0.6 g) |
| C1 | Polymer 5 (0.22 g) | Polymer 8 (74 mg) | T1 (4.5 mg) | HBM (8.32 g), PGMEA (20.8 g) |
| C2 | MN 4603S (0.22 g) | Polymer 8 (74 mg) | T1 (4.5 mg) | HBM (8.32 g), PGMEA (20.8 g) |

TABLE 3-continued

| Underlayer Composition | Δstrip (nm) |
| --- | --- |
| Example 6 | −0.7 |
| Example 7 | −0.9 |
| Example 8 | −0.4 |
| Example 9 | −1.0 |
| Comparative example 1 | −0.2 |
| Comparative example 2 | −0.6 |

Resist Pattern Formation Evaluation

The underlayer compositions were separately spin coated on a silicon wafer at 1500 rpm using a spinner and the wafer was heated at 205° C. for 60 seconds on a hot plate to form a thin film for E-beam lithography (film thickness of 5 nm). A resist solution (methacrylate-based positive type chemically amplified E-beam resist) was applied on the thin film with a spinner at 1200 rpm and then heated at 110° C. for 60 seconds on a hot plate to form a resist film (film thickness of 40 nm). The dose of operation for 30, 70 nm 1 to 1 L/S patterning resist on underlayer examples were evaluated by direct E-beam writing using E-beam lithography tools (JBX 9300FS from JEOL 100 keV) to verify the effect of higher EUV absorption underlayer compositions. The underlayer compositions of Examples 4 to 6 showed meaningful improvement in sensitivity relative to Comparative Example 1. The results are shown in Table 4.

TABLE 4

| Underlayer Composition | $E_{op}$ for 30 nm half-pitch patterning (μC/cm²) | $E_{op}$ for 70 nm half-pitch patterning (μC/cm²) |
| --- | --- | --- |
| Example 4 | 380 | 280 |
| Example 5 | 400 | 300 |
| Example 6 | 380 | 300 |
| Comparative example 1 | 420 | 380 |

Dry Etch Rate Evaluation

The etch rates for the underlayer compositions of Examples 1 to 9 were determined with $CF_4$ gas with a CCP type etcher using the following conditions: $CF_4$ 100 sccm for 20 seconds, 7 Mt RF power, temperature: 20° C. Two wafers were coated with the underlayer compositions, spun at 1500 rpm, and baked at 205° C. The film thickness was measured. The coated wafers were then etched for 20 seconds. The film thickness of each wafer was measured again. The dry etch rate was determined based on the decrease in film thickness after the etch process. The underlayer compositions of Examples 1 to 9 showed faster dry etch rates than the novolac-based underlayer composition of Comparative Example 2, demonstrating the advantage in etch selectivity with EUV photoresist for pattern transfer processes. The results are shown in Table 5.

TABLE 5

| Underlayer Composition | Etch rate (Å/s) (vs. Comparative Example 2) |
| --- | --- |
| Example 1 | 2.1 |
| Example 2 | 2.2 |
| Example 3 | 2.0 |
| Example 4 | 2.1 |
| Example 5 | 2.2 |
| Example 6 | 1.9 |
| Example 7 | 1.9 |

TABLE 5-continued

| Underlayer Composition | Etch rate (Å/s) (vs. Comparative Example 2) |
| --- | --- |
| Example 8 | 2.0 |
| Example 9 | 2.2 |
| Comparative example 2 | 1 |

While this disclosure has been described in connection with what is presently considered to be practical exemplary aspects, it is to be understood that the invention is not limited to the disclosed aspects, but, on the contrary, is intended to cover various modifications and equivalent arrangements included within the spirit and scope of the appended claims.

The invention claimed is:

1. A coating composition, comprising:
   a crosslinkable polyester polymer comprising an isocyanurate group and a crosslinkable group;
   a crosslinker; and
   an acid catalyst;
   wherein the crosslinker comprises an iodine-containing polymer.

2. The coating composition of claim 1, wherein the crosslinkable polyester polymer comprises an iodine-containing polyester polymer derived from a compound of Formula (1):

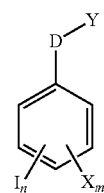

(1)

wherein, in Formula (I),
   D is a single bond, or an unsubstituted or substituted $C_{1-4}$ alkylene group;
   Y is —H, —OH, —C(O)OH, —C(O)OR$^b$, or epoxy;
   R$^b$ is hydrogen, an unsubstituted or substituted $C_{1-10}$ alkyl group, an unsubstituted or substituted $C_{3-30}$ cycloalkyl group, an unsubstituted or substituted $C_{1-30}$ heterocycloalkyl group, an unsubstituted or substituted $C_{6-30}$ aryl group, an unsubstituted or substituted $C_{7-30}$ arylalkyl group, an unsubstituted or substituted $C_{1-30}$ heteroaryl group, or an unsubstituted or substituted $C_{3-30}$ heteroarylalkyl group;
   I is an iodine atom;
   each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted C$_{6-30}$ arylthio group, an unsubstituted or substituted C$_{7-30}$ arylalkyl group, an unsubstituted or substituted C$_{1-30}$ heteroaryl group, an unsubstituted or substituted C$_{2-30}$ heteroaryloxy group, an unsubstituted or substituted C$_{2-30}$ heteroarylthio group, or an unsubstituted or substituted C$_{3-30}$ heteroarylalkyl group; and m is an integer of 0 to 4; n is an integer of 1 to 3; and the sum of m and n is less than 6.

3. The coating composition of claim 2, wherein
in Formula (1), D is a single bond and Y is —OH, —C(O)OH, or epoxy; or the compound of Formula (1) has a structure of Formula (1a):

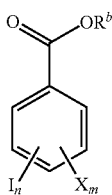

(1a)

wherein, in Formula (1a),

R$^b$ is an unsubstituted or substituted C$_{1-10}$ alkyl group, an unsubstituted or substituted C$_{3-30}$ cycloalkyl group, an unsubstituted or substituted C$_{1-30}$ heterocycloalkyl group, an unsubstituted or substituted C$_{6-30}$ aryl group, an unsubstituted or substituted C$_{7-30}$ arylalkyl group, an unsubstituted or substituted C$_{1-30}$ heteroaryl group, or an unsubstituted or substituted C$_{3-30}$ heteroarylalkyl group; and I, X, m, and n are the same as in claim 2.

4. The coating composition of claim 2, wherein the crosslinkable polyester polymer comprises an isocyanurate repeating unit derived from a monomer of Formula (2):

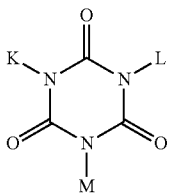

(2)

wherein, in Formula (2),

K, L, and M are each independently a linear or branched C$_{1-10}$ hydrocarbon group, a C$_{1-10}$ alkoxycarbonyl group, a C$_{1-10}$ alkanoyloxy group, each of which is optionally substituted with a carboxylic acid group, or a linear or branched C$_{1-10}$ hydroxyalkyl group optionally substituted with a C$_{1-5}$ alkoxycarbonyl group or a C$_{1-5}$ substituted alkoxy group, wherein each of the C$_{1-10}$ hydrocarbon group, the C$_{1-10}$ alkoxycarbonyl group, the C$_{1-10}$ alkanoyloxy group, and the C$_{1-10}$ hydroxyalkyl group is optionally substituted with at least one of a halogen, an amino group, a thiol group, an epoxy group, an amido group, a C$_{1-5}$ alkyl group, a C$_{3-8}$ cycloalkyl group, a C$_{3-20}$ heterocycloalkyl group, a C$_{2-5}$ alkenyl group, a C$_{1-5}$ alkoxy group, a C$_{2-5}$ alkenoxy group, a C$_{6-10}$ aryl group, a C$_{6-10}$ aryloxy group, a C$_{7-10}$ alkylaryl group, or C$_{7-10}$ alkylaryloxy group, and wherein at least one hydrogen atom of the polyester polymer is substituted with a functional group independently chosen from hydroxyl, carboxyl, thiol, amino, epoxy, alkoxy, amido, vinyl, and a combination thereof.

5. The coating composition of claim 1, wherein the crosslinker comprises an iodine-containing poly(meth)acrylate polymer derived from a monomer of Formula (3):

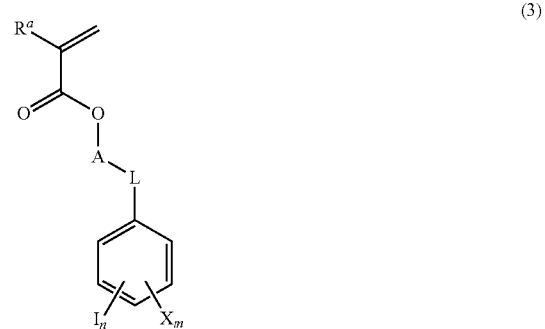

wherein, in Formula (3),

R$^a$ is hydrogen, fluorine, cyano, a C$_{1-10}$ alkyl group, or a C$_{1-10}$ fluoroalkyl group;

A is an unsubstituted or substituted C$_{1-30}$ alkylene group, an unsubstituted or substituted C$_{3-30}$ cycloalkylene group, an unsubstituted or substituted C$_{1-30}$ heterocycloalkylene group, an unsubstituted or substituted C$_{6-30}$ arylene group, an unsubstituted or substituted divalent C$_{7-30}$ arylalkyl group, an unsubstituted or substituted C$_{1-30}$ heteroarylene group, or an unsubstituted or substituted divalent C$_{3-30}$ heteroarylalkyl group;

L is —O—, —O(C=O)—, —(C=O)O—, —O(SO$_2$)—, —(SO$_2$)O—, —NH(SO$_2$)—, —(SO$_2$)NH—, —NH(CO)—, —(CO)NH—, —SO$_2$—, or —SO—;

I is an iodine atom;

each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted C$_{1-30}$ alkyl group, an unsubstituted or substituted C$_{2-30}$ alkenyl group, an unsubstituted or substituted C$_{2-30}$ alkynyl group, an unsubstituted or substituted C$_{1-30}$ alkoxy group, an unsubstituted or substituted C$_{3-30}$ cycloalkyl group, an unsubstituted or substituted C$_{1-30}$ heterocycloalkyl group, an unsubstituted or substituted C$_{3-30}$ cycloalkenyl group, an unsubstituted or substituted C$_{1-30}$ heterocycloalkenyl group, an unsubstituted or substituted C$_{6-30}$ aryl group, an unsubstituted or substituted C$_{6-30}$ aryloxy group, an unsubstituted or substituted C$_{6-30}$ arylthio group, an unsubstituted or substituted C$_{7-30}$ arylalkyl group, an unsubstituted or substituted C$_{1-30}$ heteroaryl group, an unsubstituted or substituted C$_{2-30}$ heteroaryloxy group, an unsubstituted or substituted C$_{2-30}$ heteroarylthio group, or an unsubstituted or substituted C$_{3-30}$ heteroarylalkyl group; and m is an integer of 0 to 4; n is an integer of 1 to 3; and the sum of m and n is less than 6.

6. The coating composition of claim 5, wherein the iodine-containing poly(meth)acrylate polymer comprises a functional group selected from hydroxyl, carboxyl, thiol, amino, epoxy, alkoxy, amido, vinyl, or a combination thereof.

7. The coating composition of claim 1, wherein the crosslinkable group of the crosslinkable polymer comprises a functional group selected from hydroxyl, carboxyl, thiol, amino, epoxy, alkoxy, amido, vinyl, or a combination thereof.

8. The coating composition of claim 1, further comprising a solvent.

9. A coated substrate comprising:
a layer of the coating composition of claim 8 disposed on a substrate; and
a photoresist layer disposed on the layer of the coating composition.

10. The coated substrate of claim 9, wherein the crosslinkable polyester polymer comprises an iodine-containing polyester polymer derived from a compound of Formula (1):

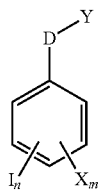
(1)

wherein, in Formula (I),
D is a single bond, or an unsubstituted or substituted $C_{1-4}$ alkylene group;
Y is —H, —OH, —C(O)OH, —C(O)OR$^b$, or epoxy;
R$^b$ is hydrogen, an unsubstituted or substituted $C_{1-10}$ alkyl group, an unsubstituted or substituted $C_{3-30}$ cycloalkyl group, an unsubstituted or substituted $C_{1-30}$ heterocycloalkyl group, an unsubstituted or substituted $C_{6-30}$ aryl group, an unsubstituted or substituted $C_{7-30}$ arylalkyl group, an unsubstituted or substituted $C_{1-30}$ heteroaryl group, or an unsubstituted or substituted $C_{3-30}$ heteroarylalkyl group;
I is an iodine atom;
each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group; and
m is an integer of 0 to 4; n is an integer of 1 to 3; and the sum of m and n is less than 6.

11. The coated substrate of claim 9, wherein the crosslinker comprises an iodine-containing poly(meth)acrylate polymer derived from a monomer of Formula (3):

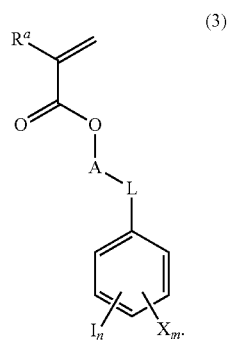
(3)

wherein, in Formula (3),
R$^a$ is hydrogen, fluorine, cyano, a $C_{1-10}$ alkyl group, or a $C_{1-10}$ fluoroalkyl group;
A is an unsubstituted or substituted $C_{1-30}$ alkylene group, an unsubstituted or substituted $C_{3-30}$ cycloalkylene group, an unsubstituted or substituted $C_{1-30}$ heterocycloalkylene group, an unsubstituted or substituted $C_{6-30}$ arylene group, an unsubstituted or substituted divalent $C_{7-30}$ arylalkyl group, an unsubstituted or substituted $C_{1-30}$ heteroarylene group, or an unsubstituted or substituted divalent $C_{3-30}$ heteroarylalkyl group;
L is —O—, —O(C=O)—, —(C=O)O—, —O(SO$_2$)—, —(SO$_2$)O—, —NH(SO$_2$)—, —(SO$_2$)NH—, —NH(CO)—, —(CO)NH—, —SO$_2$—, or —SO—;
I is an iodine atom;
each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group; and
m is an integer of 0 to 4; n is an integer of 1 to 3; and the sum of m and n is less than 6.

12. The coated substrate of claim 11, wherein the iodine-containing poly(meth)acrylate polymer comprises a functional group selected from hydroxyl, carboxyl, thiol, amino, epoxy, alkoxy, amido, vinyl, or a combination thereof.

13. The coated substrate of claim 9, wherein the crosslinkable group of the crosslinkable polymer comprises a functional group selected from hydroxyl, carboxyl, thiol, amino, epoxy, alkoxy, amido, vinyl, or a combination thereof.

14. A method of forming an electronic device, comprising:
applying a layer of the coating composition of claim 8 on a substrate;
curing the coating composition to form an underlayer film;
applying a layer of a photoresist composition on the underlayer film to form a photoresist layer;
pattern-wise exposing the photoresist layer to radiation; and
developing the exposed photoresist layer to provide a resist relief image.

15. The method of claim 14, wherein the crosslinkable polyester polymer comprises an iodine-containing polyester polymer derived from a compound of Formula (1):

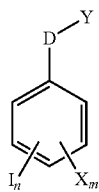

(1)

wherein, in Formula (I),
D is a single bond, or an unsubstituted or substituted $C_{1-4}$ alkylene group;
Y is —H, —OH, —C(O)OH, —C(O)OR$^b$, or epoxy;
R$^b$ is hydrogen, an unsubstituted or substituted $C_{1-10}$ alkyl group, an unsubstituted or substituted $C_{3-30}$ cycloalkyl group, an unsubstituted or substituted $C_{1-30}$ heterocycloalkyl group, an unsubstituted or substituted $C_{6-30}$ aryl group, an unsubstituted or substituted $C_{7-30}$ arylalkyl group, an unsubstituted or substituted $C_{1-30}$ heteroaryl group, or an unsubstituted or substituted $C_{3-30}$ heteroarylalkyl group;
I is an iodine atom;
each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group; and
m is an integer of 0 to 4; n is an integer of 1 to 3; and the sum of m and n is less than 6.

16. The method of claim 15, wherein
in Formula (1), D is a single bond and Y is —OH, —C(O)OH, or epoxy; or the compound of Formula (1) has a structure of Formula (1a):

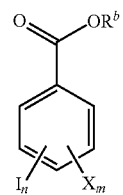

(1a)

wherein, in Formula (1a),
R$^b$ is an unsubstituted or substituted $C_{1-10}$ alkyl group, an unsubstituted or substituted $C_{3-30}$ cycloalkyl group, an unsubstituted or substituted $C_{1-30}$ heterocycloalkyl group, an unsubstituted or substituted $C_{6-30}$ aryl group, an unsubstituted or substituted $C_{7-30}$ arylalkyl group, an unsubstituted or substituted $C_{1-30}$ heteroaryl group, or an unsubstituted or substituted $C_{3-30}$ heteroarylalkyl group; and
I, X, m, and n are the same as in claim 15.

17. The method of claim 15, wherein the crosslinkable polyester polymer comprises an isocyanurate repeating unit derived from a monomer of Formula (2):

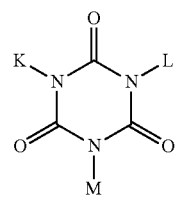

(2)

wherein, in Formula (2),
K, L, and M are each independently a linear or branched $C_{1-10}$ hydrocarbon group, a $C_{1-10}$ alkoxycarbonyl group, a $C_{1-10}$ alkanoyloxy group, each of which is optionally substituted with a carboxylic acid group, or a linear or branched $C_{1-10}$ hydroxyalkyl group optionally substituted with a $C_{1-5}$ alkoxycarbonyl group or a $C_{1-5}$ substituted alkoxy group,
wherein each of the $C_{1-10}$ hydrocarbon group, the $C_{1-10}$ alkoxycarbonyl group, the $C_{1-10}$ alkanoyloxy group, and the $C_{1-10}$ hydroxyalkyl group is optionally substituted with at least one of a halogen, an amino group, a thiol group, an epoxy group, an amido group, a $C_{1-5}$ alkyl group, a $C_{3-8}$ cycloalkyl group, a $C_{3-20}$ heterocycloalkyl group, a $C_{2-5}$ alkenyl group, a $C_{1-5}$ alkoxy group, a $C_{2-5}$ alkenoxy group, a $C_{6-10}$ aryl group, a $C_{6-10}$ aryloxy group, a $C_{7-10}$ alkylaryl group, or $C_{7-10}$ alkylaryloxy group, and
wherein at least one hydrogen atom of the polyester polymer is substituted with a functional group independently chosen from hydroxyl, carboxyl, thiol, amino, epoxy, alkoxy, amido, vinyl, and a combination thereof.

18. The method of claim 14, wherein the crosslinker comprises an iodine-containing poly(meth)acrylate polymer derived from a monomer of Formula (3):

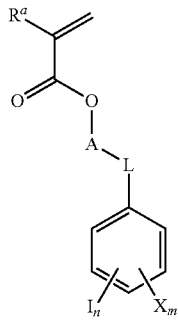

(3)

wherein, in Formula (3), $R^a$ is hydrogen, fluorine, cyano, a $C_{1-10}$ alkyl group, or a $C_{1-10}$ fluoroalkyl group;

A is an unsubstituted or substituted $C_{1-30}$ alkylene group, an unsubstituted or substituted $C_{3-30}$ cycloalkylene group, an unsubstituted or substituted $C_{1-30}$ heterocycloalkylene group, an unsubstituted or substituted $C_{6-30}$ arylene group, an unsubstituted or substituted divalent $C_{7-30}$ arylalkyl group, an unsubstituted or substituted $C_{1-30}$ heteroarylene group, or an unsubstituted or substituted divalent $C_{3-30}$ heteroarylalkyl group;

L is —O—, —O(C=O)—, —(C=O)O—, —O(SO$_2$)—, —(SO$_2$)O—, —NH(SO$_2$)—, —(SO$_2$)NH—, —NH(CO)—, —(CO)NH—, —SO$_2$—, or —SO—;

I is an iodine atom;

each X is independently —F, —Cl, —Br, a hydroxyl group, a cyano group, a nitro group, an amino group, an amido group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group; and m is an integer of 0 to 4; n is an integer of 1 to 3; and the sum of m and n is less than 6.

19. The method of claim 18, wherein the iodine-containing poly(meth)acrylate polymer comprises a functional group selected from hydroxyl, carboxyl, thiol, amino, epoxy, alkoxy, amido, vinyl, or a combination thereof.

20. The method of claim 14, wherein the crosslinkable group of the crosslinkable polymer comprises a functional group selected from hydroxyl, carboxyl, thiol, amino, epoxy, alkoxy, amido, vinyl, or a combination thereof.

* * * * *